(12) United States Patent
Thiagarajan et al.

(10) Patent No.: US 9,831,864 B2
(45) Date of Patent: Nov. 28, 2017

(54) PROGRAMMABLE SWITCHED CAPACITOR BLOCK

(71) Applicant: Cypress Semiconductor Corporation, San Jose, CA (US)

(72) Inventors: Eashwar Thiagarajan, Bellevue, WA (US); Harold Kutz, Edmonds, WA (US); Jaskarn Singh Johal, Mukilteo, WA (US); Erhan Hancioglu, Bothell, WA (US); Bruce Byrkett, Preston, WA (US); Hans Klein, Pleasanton, CA (US); Mark Hastings, Mukilteo, WA (US); Dennis Seguine, Temecula, CA (US); Monte Mar, Issaquah, WA (US); Gajender Rohilla, Bothell, WA (US); Kendall Castor-Perry, Seattle, WA (US); Onur Ozbek, Kirkland, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/865,999

(22) Filed: Sep. 25, 2015

(65) Prior Publication Data

US 2016/0118973 A1  Apr. 28, 2016

Related U.S. Application Data

(63) Continuation-in-part of application No. 14/493,635, filed on Sep. 23, 2014.
(Continued)

(51) Int. Cl.
*H03M 1/12* (2006.01)
*H03K 17/00* (2006.01)
(Continued)

(52) U.S. Cl.
CPC ......... *H03K 17/00* (2013.01); *H03F 3/45475* (2013.01); *H03H 19/004* (2013.01); *H03F 2203/45512* (2013.01)

(58) Field of Classification Search
CPC .... H03M 1/442; H03M 1/068; H03M 1/0682; H03M 1/468
(Continued)

(56) References Cited

U.S. PATENT DOCUMENTS 5,220,286 A  6/1993  Nadeem
5,359,294 A  10/1994  Ganger et al.
(Continued)

FOREIGN PATENT DOCUMENTS

CN  101194416 A  6/2008
CN  103199806 A  7/2013
WO  2007054209 A1  5/2007

OTHER PUBLICATIONS

Analog Devices, "Differential/Single-Ended Input, Dual 2 MSPS, 12-Bit, 3-Channel SAR ADC", www.analog.com, Rev. B, AD7266, 28 pages.
(Continued)

*Primary Examiner* — Linh Nguyen
(74) *Attorney, Agent, or Firm* — Lowenstein Sandler LLP

(57) ABSTRACT

A first portion of a programmable switched capacitor block includes a first plurality of switched capacitors and a second portion of the programmable switched capacitor block includes a second plurality of switched capacitors. A first switch associated with the first plurality of switched capacitors as well as a second switch associated with the second plurality of switched capacitors may be configured based on a type of analog function that is to be provided. The configuring of the first analog and the second analog block may include the configuring of the first switch associated
(Continued)

with the first plurality of switched capacitors when the analog function operates on a first single ended signal and the configuring of both the first and second switches when the analog function operates on a differential signal.

19 Claims, 21 Drawing Sheets

Related U.S. Application Data

(60) Provisional application No. 62/005,532, filed on May 30, 2014, provisional application No. 62/083,824, filed on Nov. 24, 2014.

(51) Int. Cl.
  *H03H 19/00* (2006.01)
  *H03F 3/45* (2006.01)

(58) Field of Classification Search
  USPC .............................. 341/143, 150, 172, 122
  See application file for complete search history.

(56) References Cited

U.S. PATENT DOCUMENTS

| | | | |
|---|---|---|---|
| 5,608,345 A | 3/1997 | MacBeth et al. | |
| 5,617,093 A | 4/1997 | Klein | |
| 5,654,984 A | 8/1997 | Hershbarger et al. | |
| 5,973,536 A | 10/1999 | Maejima | |
| 6,243,776 B1 | 6/2001 | Lattimore et al. | |
| 6,377,084 B1 | 4/2002 | Forbes | |
| 6,819,178 B2 | 11/2004 | Pihlstrom et al. | |
| 6,836,290 B1 | 12/2004 | Chung et al. | |
| 7,449,951 B2 | 11/2008 | Oh | |
| 7,843,232 B2 | 11/2010 | Farhat et al. | |
| 8,139,674 B2 | 3/2012 | Jaso | |
| 8,198,937 B1 | 6/2012 | Boas et al. | |
| 8,306,494 B2 | 11/2012 | Ojo | |
| 8,446,988 B2 | 5/2013 | Chung et al. | |
| 8,860,599 B1* | 10/2014 | Lien | H03M 1/34 341/155 |
| 2002/0149508 A1 | 10/2002 | Hamashita | |
| 2003/0171107 A1 | 9/2003 | Sorrells et al. | |
| 2004/0246162 A1* | 12/2004 | Leung | H03M 1/1057 341/172 |
| 2005/0219097 A1 | 10/2005 | Atriss et al. | |
| 2006/0284754 A1 | 12/2006 | Garrity et al. | |
| 2008/0018514 A1* | 1/2008 | Ryu | H03M 1/06 341/150 |
| 2008/0129576 A1 | 6/2008 | Jeon et al. | |
| 2009/0102695 A1* | 4/2009 | Kawahito | H03M 1/08 341/172 |
| 2009/0185406 A1 | 7/2009 | Uno | |
| 2010/0141499 A1 | 6/2010 | Mathe | |
| 2010/0142653 A1* | 6/2010 | Furuta | H03M 1/0682 375/340 |
| 2010/0179977 A1 | 7/2010 | Wei et al. | |
| 2010/0308870 A1 | 12/2010 | Kumakura | |
| 2011/0006937 A1* | 1/2011 | Zoso | H03M 3/422 341/143 |
| 2011/0012765 A1 | 1/2011 | Hsieh et al. | |
| 2011/0200070 A1 | 8/2011 | Makinwa et al. | |
| 2011/0221504 A1 | 9/2011 | Thiagarajan et al. | |
| 2011/0298644 A1 | 12/2011 | Ohba | |
| 2012/0112948 A1 | 5/2012 | Tual et al. | |
| 2012/0274489 A1* | 11/2012 | Chang | H03M 1/462 341/110 |
| 2013/0002469 A1 | 1/2013 | Kull | |
| 2013/0187803 A1* | 7/2013 | Kaald | H03M 3/37 341/143 |
| 2013/0194034 A1 | 8/2013 | Giuroiu | |
| 2014/0354458 A1* | 12/2014 | Kakamu | H03M 1/129 341/122 |
| 2015/0084798 A1* | 3/2015 | Nezuka | H03M 1/001 341/143 |
| 2015/0194976 A1* | 7/2015 | Chiang | H03M 1/0845 341/118 |
| 2015/0249445 A1* | 9/2015 | Dong | H03K 5/159 341/143 |
| 2015/0288380 A1* | 10/2015 | Zhao | H03M 1/1038 341/120 |

OTHER PUBLICATIONS

Differential Input Dual 2 MSPS 12 Bit 3 Channel SAR ADC, Analog Devices, p. 17, Norwood, MA.

International Search Report for International Application No. PCT/US15/33135 dated Sep. 14, 2015; 2 pages.

International Search Report for International Application No. PCT/US15/61496 dated Mar. 11, 2016; 2 pages.

U.S. Advisory Action for U.S. Appl. No. 14/493,635 dated Nov. 25, 2016; 3 pages.

U.S. Final Rejection for U.S. Appl. No. 14/493,635 dated Sep. 28, 2016; 11 pages.

U.S. Non-Final Rejection for U.S. Appl. No. 14/493,635 dated Jun. 23, 2016; 9 pages.

Written Opinion of the International Searching Authority for International Application No. PCT/US15/33135 dated Sep. 14, 2015, 6 pages.

Written Opinion of the International Searching Authority for International Application No. PCT/US2015/61496 dated Mar. 11, 2016; 7pages.

Kevin R. Hoskins and Derek V. Redmayne, "LTC2400 High Accuracy Differential to Single-ended Converter for ±5V Supplies"; 2 pages.

Texas Instruments, "Four Output Clock Generator/Jitter Cleaner With Integrated Dual VCOs", Feb. 1, 2012; 48 pages.

U.S. Non-Final Rejection for U.S. Appl. No. 14/493,635 dated Jun. 1, 2017; 15 pages.

USPTO Advisory Action for U.S. Appl. No. 14/493,635 dated Aug. 10, 2017; 2 pages.

USPTO Notice of Allowance for U.S. Appl. No. 14/493,635 dated Sep. 7, 2017; 17 pages.

* cited by examiner

PROGRAMMABLE SWITCHED CAPACITOR BLOCK

RELATED APPLICATIONS

This application is a continuation-in-part of U.S. patent application Ser. No. 14/493,635 filed on Sep. 23, 2014 which claims the benefit of U.S. Provisional Application No. 62/005,532 filed on May 30, 2014 and this application further claims the benefit of U.S. Provisional Application No. 62/083,824 filed on Nov. 24, 2014, the entire contents of which are incorporated by reference.

TECHNICAL FIELD

The present disclosure relates generally to processing devices and particularly to processing devices having a programmable switched capacitor block.

BACKGROUND

Processing devices, such as microcontrollers, may have embedded processors, memories, and special function analog circuits. Typical analog circuits found in microcontrollers include Continuous Time (CT) amplifiers having preset functions with given functional parameters. For instance, a CT analog amplifier may be a fixed function circuit, such as a voltage amplifier, in which certain parameters, such as gain or bandwidth may be changed or altered.

Switched Capacitor (SC) analog circuits are also frequently incorporated into microcontroller designs. A SC analog circuit may be more versatile than CT analog circuits in that it may be possible to alter certain circuit functions as well as the parameters of the circuit function. However, both CT and SC analog circuits found in current microcontrollers cannot generally be dynamically programmed (e.g., programmed "on-the-fly").

Several other design considerations related to microcontroller utilization either go unaddressed, or require separate functionalities to enable them. For instance, existing designs do not offer a programmable analog circuit that may be used to implement various functions on the same semiconductor chip. As a result, realization of an analog function may require fixed functional analog blocks. If a microcontroller design is to include multiple analog functions, then each of the analog functions may require a separate fixed functional analog circuit requiring additional space on the semiconductor chip and additional complexity with regard to the semiconductor chip design. Further, existing microcontroller realizations generally require pre-programming and cannot be dynamically programmed.

BRIEF DESCRIPTION OF THE DRAWINGS

The present disclosure is illustrated by way of example, and not of limitation, in the figures of the accompanying drawings in which.

DETAILED DESCRIPTION

Figure 1:
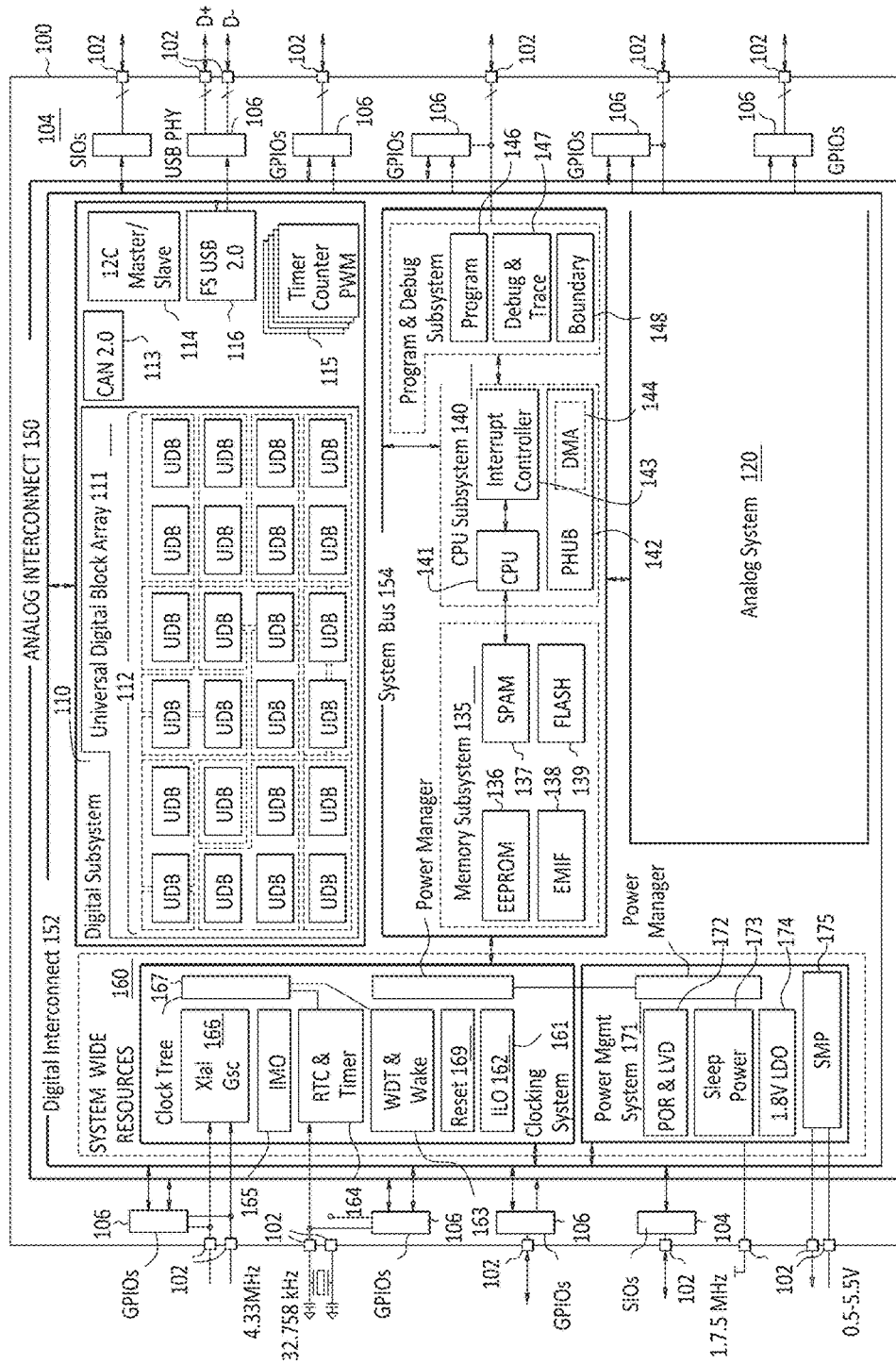
FIG. 1 illustrates an embodiment of a core architecture of a processing device.

Aspects of the present disclosure are directed to a programmable switched capacitor block. A processing device may include the programmable switched capacitor block. For example, a system on a chip (SoC) may include the programmable switched capacitor block to implement multiple analog functions. The programmable switched capacitor block may be configured or programmed to implement a first analog function at a first time and the programmable switched capacitor block may be configured or programmed to implement a second analog function at a second time. Accordingly, the same programmable switched capacitor block may be used to implement various analog functions.

The programmable switched capacitor block may include multiple switched capacitors. A switched capacitor may refer to an electronic circuit component that uses one or more switches to move charge into and out of capacitors as one or more of the switches are open and closed. A switch may refer to an electronic circuit component that can either be in an opened state (i.e., the switch is non-conducting) or in a closed state (i.e., the switch is conducting). The programmable switched capacitor block may include multiple branches that each include multiple switched capacitors. Furthermore, the programmable switched capacitor block may include additional circuit components (e.g., operational amplifiers, comparators, buffers, etc.) that may receive the charge from the capacitors in the switched capacitors from the branches of the programmable switched capacitor block to implement a particular analog function and to provide an analog output signal. For example, specific switches of the programmable switched capacitor block may be configured (e.g., opened or closed) in order to implement a desired analog function and to output a corresponding analog signal. Accordingly, switches of the programmable switched capacitor block may be opened or closed to implement the desired analog function.

In some embodiments, the programmable switched capacitor block may include two portions, or half blocks, where each half block may be used to implement a different analog function and to output a single ended signal. Alternatively, both half blocks of the same programmable switched capacitor block may be used to implement one analog function and to output a differential signal. A differential signal may refer to a signal that is based on two complementary signals transmitted over two separate wires and a single ended signal may refer to a signal that is transmitted over a wire that represents the signal while another wire is connected to a reference voltage (e.g., ground). Each half block of the programmable switched capacitor block may be configured to implement a separate analog function and to provide or output a separate single ended signal. Alternatively, the programmable switched capacitor block may be configured to provide a differential signal based on the use of both half blocks. Accordingly, the programmable switched capacitor block may be configured or programmed to operate in a single ended mode where each half portion of the programmable switched capacitor block may output an independent single ended signal. Additionally, the programmable switched capacitor block may be configured or programmed to operate in a differential mode where each half block of the programmable switched capacitor block is used to output the complementary signals of a differential signal.

Thus, since the programmable switched capacitor block may be used to provide multiple analog functions as well as single ended and differential signals, a SoC or other such processing device may use the programmable switched capacitor block to implement analog functionality when needed as opposed to requiring multiple fixed functional analog blocks to provide each analog function to be included in the SoC or a processing device.

Reference in the description to "one embodiment," "an embodiment," or "some embodiments" means that a particular feature, structure, or characteristic described in connection with the embodiment is included in at least one embodiment of the disclosure. The phrase "in one embodiment" or "in some embodiments" located in various places in this description does not necessarily refer to the same embodiment.

FIG. 1 illustrates an embodiment of a core architecture of a processing device 100. In one embodiment, the processing device 100 is a core architecture of the Programmable System-on-Chip (PSoC®) device, such as that used in the PSoC® family of products offered by Cypress Semiconductor Corporation (San Jose, Calif.). In one embodiment, the processing device 100 has the PSoC®3 or PSoC®5 core architecture, each developed by Cypress Semiconductor Corporation. In one embodiment, the core architecture includes a digital subsystem 110. The digital subsystem 110 includes a universal digital block array 111, including multiple universal digital blocks (UDBs) 112, a CAN 2.0 interface controller (CAN 2.0) 113, an I2C Master and Slave controller (I2C M/S) 114, multiple multifunction digital blocks (MDBs) 115 and a full-speed USB 2.0 interface controller (FSUSB 2.0) 116. MDBs 115 may be configured to perform common digital functions such as timers, counters and pulse-width modulators (PWMs). Digital subsystem 110 may also include communication peripherals such as Ethernet, high-speed USB, USB host, PCI Express, IEE1394 serial bus interface, SD card reader and others (not shown) The elements of digital system 110 may be coupled to digital interconnect 152 and/or to the system bus 154.

The core architecture may also include an analog subsystem 120. The analog subsystem may include a programmable switched capacitor block or may include a programmable switched capacitor block.

The core architecture 100 may also include memory subsystem 135, CPU subsystem 140 and programming and debug subsystem 145. Memory subsystem 135 may include an EEPROM block 136, synchronous random access memory (SRAM) 137, an external memory interface (EMIF) block 138, and flash memory (FLASH) 139. Memory subsystem 135 may also include a memory cache or memory accelerator (not shown). CPU subsystem 140 may include a CPU 141, an interrupt controller 142 and a bus bridge controller (DMA/PHUB) 143, which may include a direct memory access (DMA) controller 144. The program and debug subsystem 145 may include a programming block 146, and debug and trace block 147 and a boundary scan block 148. The program and debug subsystem may be coupled to the CPU subsystem. The CPU subsystem and the memory system may be coupled to system bus 154. The memory subsystem 135 may be coupled to the CPU subsystem 140 through the system bus 154. In one embodiment, FLASH 139 may be coupled to the CPU 141 directly.

The core architecture 100 may also include system-wide resources 160. System-wide resources may include a clocking subsystem 161 and power management subsystem 171. Clocking subsystem 161 may include an internal low-speed oscillator block (ILO) 162, a watch-dog timer (WDT) and wake-up controller block 163, a real-time clock (RTC)/timer block 164, an internal main oscillator block (IMO) 165, a crystal oscillator block (Xtal Osc) 166, a clock tree 167, power manager 168 and reset block 169. In one embodiment the RTC/timer block 164 and the ILO 162 may be coupled to the WDT and wake-up controller block 163. In another embodiment, clock tree 167 may be coupled to Xtal Osc block 166 and IMO 165. Power management system 171 may include power-on-reset (POR) and low-voltage-detect (LVD) block 172, a sleep power block 173, a 1.8V internal regulator (LDO) 174, a switched mode power supply (e.g., switch-mode pump, SMP) 175 and power manager 178. The switched mode power supply may implement a boost circuit, a bust circuit or both. Power manager 178 may be coupled to power manager 168 of the clocking subsystem 161. In one embodiment, system-wide resources 160 may be coupled to system bus 154.

The core architecture 100 may also include multiple pins 102. Pins 102 may be used to connect elements of core architecture 100 to off-chip elements or route signals into, out of on-chip elements or to different pins of the device. Core architecture 100 may also include multiple special input/outputs (SIOs) 104 and GPIOs 106. SIOs 104 may be coupled to digital interconnect 152. GPIOs 106 may be coupled to analog interconnect 150, digital interconnect 152, RTC/timer block 164, and/or Xtal Osc block 166. Core architecture may also include USB input/outputs (USB PHY) 108, which may be coupled to FSUSB 2.0 116.

Figure 2:
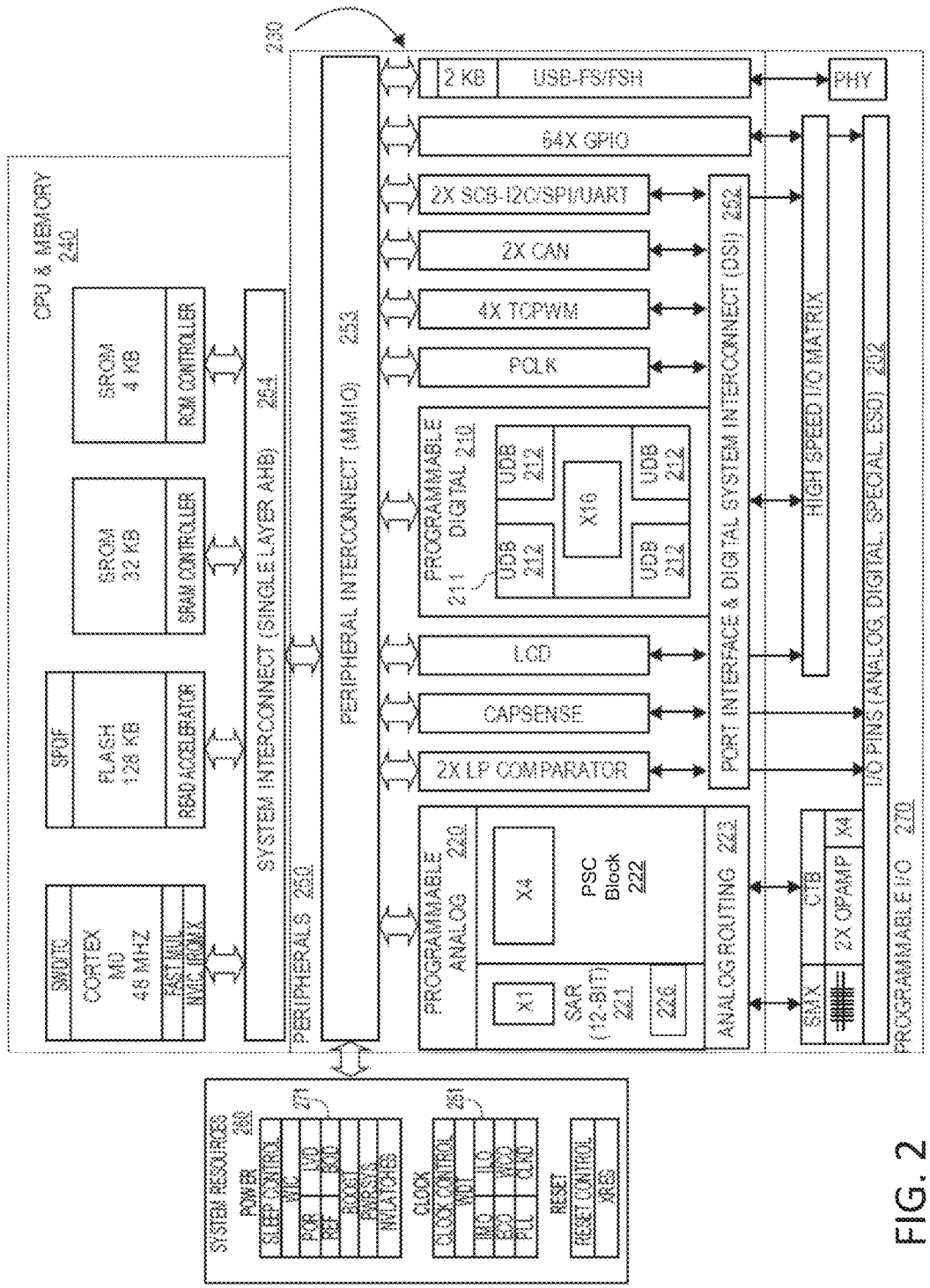
FIG. 2 illustrates another embodiment of a core architecture of a processing device with a programmable switched capacitor block.

FIG. 2 illustrates another embodiment of a core architecture of a processing device 200 with a programmable switched capacitor (PSC) block. In one embodiment, the processing device 200 has the PSoC®4 core architecture, developed by Cypress Semiconductor Corporation. In the depicted embodiment, the processing device 200 includes a CPU and memory subsystem 240, peripherals 250, system resource 260, and programmable I/O 270. The peripherals 250 include a peripheral interconnect (MMIO) 253, programmable digital subsystem 210, programmable analog subsystem 220, a port interface and digital system interconnect (DSI) 252, and various other components 230, such as comparators, capacitive sensing blocks, LCD direct drive blocks, a CAN interface controller, an I2C M/S, MDBs, and a FSUSB 2.0, as described herein. The MDBs may be configured to perform common digital functions such as timers, counters and pulse-width modulators (PWMs). The various other components may be communication peripherals such as Ethernet, high-speed USB, USB host, PCI Express, IEE1394 serial bus interface, SD card reader and others. The programmable digital subsystem 210 and some of the other components 230 are coupled to the port interface and digital subsystem interconnect (DSI) 252. The programmable digital subsystem 210, the programmable analog subsystem 220 and the other components 230 are coupled to the peripheral interconnect (MMIO) 253. The programmable analog subsystem 220 and some of the other components 230 are coupled to the programmable I/O 270.

The digital subsystem 210 includes a universal digital block array 211, including multiple UDBs 212. The digital subsystem 210 may also include other interface controller, multifunction digital blocks, communication peripherals, or the like. The elements of digital system 210 may be coupled to digital interconnect 252 and/or to a peripheral interconnection (MMIO) 253, which is coupled to the system interconnect 254 of a CPU and memory subsystem 240. The CPU and memory subsystem 240 may include FLASH, SRAM, SROM blocks and a CPU, each coupled to the system interconnect 254. The CPU and memory subsystem 240 may include other components as would be appreciated by one of ordinary skill in the art having the benefit of this disclosure.

The core architecture 200 may also include an analog subsystem 220. The analog subsystem 220 may include successive approximation registers (SARs) ADC block 221, programmable switched capacitor block 222, and analog routing 223. In another embodiment, the programmable switched capacitor block 222 is implemented in one or more other components of the programmable analog subsystem 220 or the processing device 200. In another embodiment, the programmable switched capacitor block 222 can be implemented in other locations as would be appreciated by one of ordinary skill in the art having the benefit of the disclosure. Details regarding the programmable switched capacitor block are described below with respect to FIGS. 3-8.

The core architecture of the processing device 200 may also include system-wide resources 260. System-wide resources 260 may include a clocking subsystem 261 and power management subsystem 271. Clocking subsystem 261 may include various components as described herein, such as ILO, WDT, clock control, IMO, ECO, PLL, CLKD, WCO, or the like. Power management system 171 may include various components as described herein, such as sleep control, WIC, POR, LVD, REF, BOD, Boost, PWR-SYS, NV latches, or the like. In one embodiment, system-wide resources 260 may be coupled to peripheral interconnect 253.

The core architecture 200 may also include multiple pins 202. Pins 202 may be used to connect elements of core architecture 200 to off-chip elements or route signals into, out of on-chip elements or to different pins of the device. Core architecture 200 may also include multiple SIOs and GPIOs. The programmable I/O 270 also may include a high-speed I/O matrix, a physical interface (PHY), Successive Approximation Register multiplexer (SARMUX) (also labeled as SMX), Continuous Time Block (CTB), and the like. For example, a CTB may include two operational amplifiers, a programmable resister string, and part of the analog routing interconnection, including connections to the pins. Core architecture 200 may also include USB input/outputs (USB PHY) 108, which may be coupled to FSUSB 2.0 116.

In the embodiment of FIG. 2, the processing device 200 is described in the context of the PSoC® 4 processing device. In other embodiments, the processing device may be may be one or more other processing devices known by those of ordinary skill in the art, such as a microprocessor or central processing unit, a controller, a special-purpose processor, digital signal processor ("DSP"), an application specific integrated circuit ("ASIC"), a field programmable gate array ("FPGA"), or the like.

Figure 3:
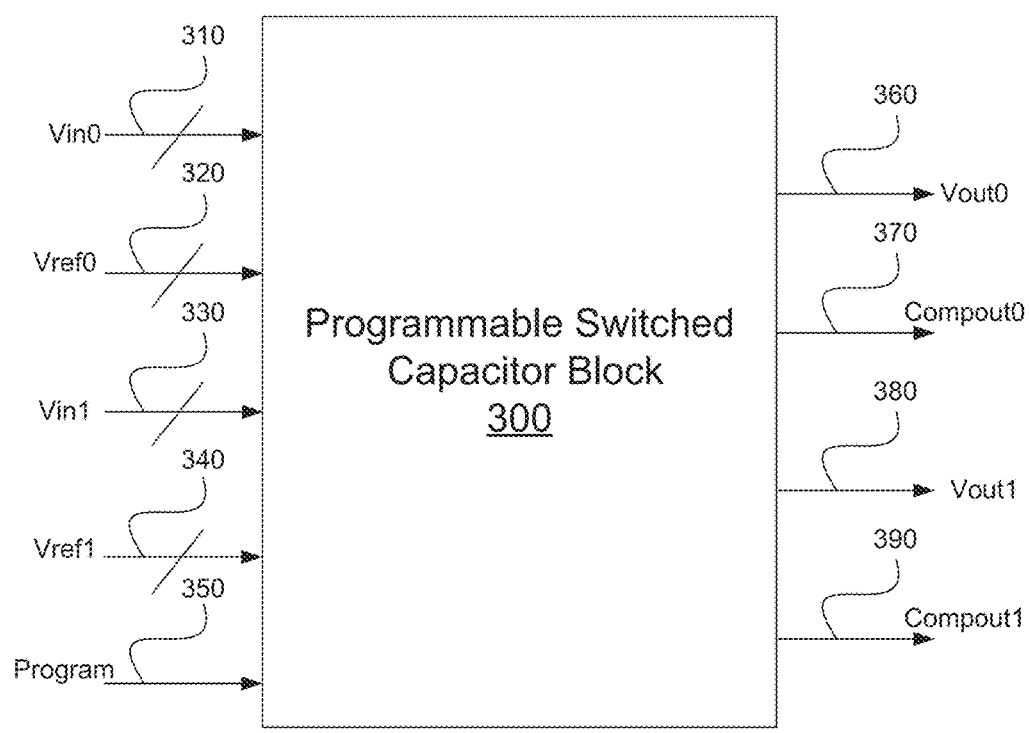
FIG. 3 is a block diagram of an example programmable switched capacitor block in accordance with some embodiments of the present disclosure.

FIG. 3 is a block diagram of an example programmable switched capacitor block 300. In general, the programmable switched capacitor block 300 may receive input signals and a programming signal to implement an analog function and output one or more signals. The programmable switched capacitor block 300 may correspond to the programmable switched capacitor block 222 of FIG. 2.

As shown in FIG. 3, the programmable switched capacitor block 300 may receive multiple input signals. For example, the programmable switched capacitor block 300 may receive input voltage signals 310 for a first half block of the programmable switched capacitor block 300 and second input voltage signals 340 for a second half block of the programmable switched capacitor block 300. In some embodiments, each of the input voltage signals 310 and the input voltage signals 330 may be a group of voltage input signals. For example, the input voltage signals 310 may include four voltage input signals (e.g., $V_{in00}$, $V_{in01}$, $V_{in02}$, and $V_{in03}$) and the input voltage signals 340 may also include four input voltage signals (e.g., $V_{in10}$, $V_{in11}$, $V_{in12}$, and $V_{in13}$). Accordingly, the programmable switched capacitor block 300 may receive two sets or groups of input voltage signals.

Furthermore, the programmable switched capacitor block 300 may receive first voltage reference signals 320 and second voltage reference signals 340. For example, the first voltage reference signals 320 may be a group of voltage reference signals for a first half block of the programmable switched capacitor block 300 and the second voltage reference signals 340 may be a group of voltage reference signals for a second half block of the programmable switched capacitor block 300. In some embodiments, the first voltage reference signals 320 may include a first and second voltage reference signal (e.g., $V_{ref00}$ and $V_{ref01}$) and the second voltage reference signals 340 may include another first and second voltage reference signal (e.g., $V_{ref10}$ and $V_{ref\ 11}$). In the same or alternative embodiments, one of the voltage reference signals may correspond to a ground reference signal. Additionally, the programmable switched capacitor block 300 may receive a programming signal 350. In some embodiments, the programming signal 350 may specify an analog function that is based on either single ended signaling or differential signaling. As discussed in further detail below, the programmable switched capacitor block 300 may configure one or more switches (e.g., open or close the switches) based on the analog function and the type of signaling (e.g., single ended or differential) that is identified from the programming signal 350.

Referring to FIG. 3, the programmable switched capacitor block 300 may transmit a first voltage output signal 360, a first comparator output signal 370, a second voltage output signal 380, and a second comparator output signal 390. A first half block of the programmable switched capacitor block 300 may generate the first voltage output signal 360 and the first comparator output signal 370 and a second half block of the programmable switched capacitor block 300 may generate the second voltage output signal 380 and the second comparator output signal 390. Further details with regard to each of the first half block and the second half block of the programmable switched capacitor block 300 are disclosed with regard to FIGS. 4-8.

Figure 4:
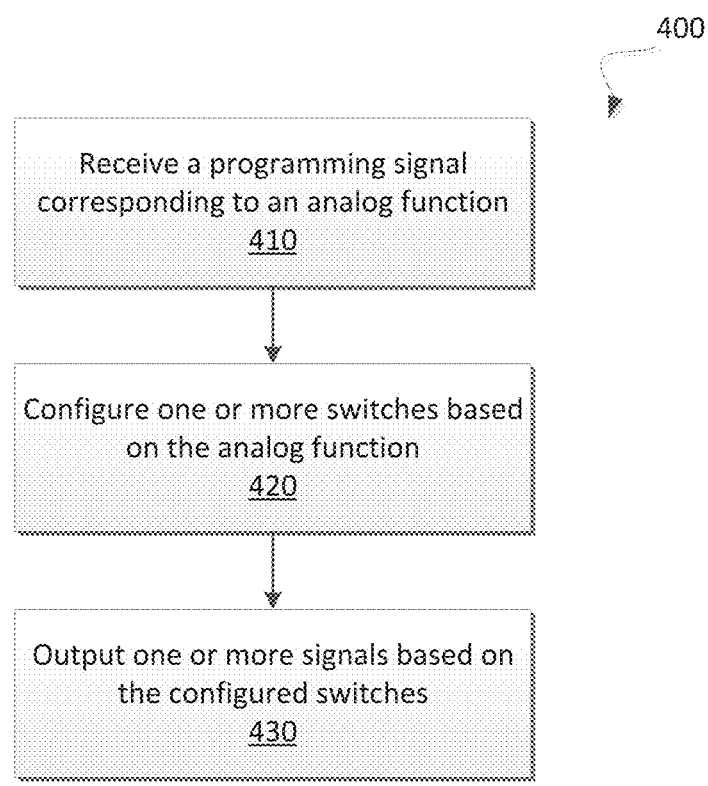
FIG. 4 is a flow diagram of an example method to configure a programmable switched capacitor block based on an analog function in accordance with some embodiments.

FIG. 4 is a flow diagram of an example method 400 to configure a programmable switched capacitor block based on an analog function. The method 400 may be performed by processing logic that may include hardware (circuitry, dedicated logic, etc.), software (such as is run on a computing system or a dedicated machine), firmware (embedded software), or any combination thereof. In general, the programmable switched capacitor blocks 222 and 300 of FIGS. 2 and 3 may perform the method 400.

As shown in FIG. 4, the method 400 may begin with the processing logic receiving a programming signal (e.g., program signal 350) corresponding to an analog function (block 410). In some embodiments, the programming signal may specify that a programmable switched capacitor block that receives the programming signal is to be configured or programmed to implement the requested analog function and to output either a single ended signal or a differential signal. In the same or alternative embodiments, the programming signal may be received from a microcontroller on a processing device that includes the programmable switched capacitor block. The processing logic may configure one or more switches based on the analog function (block 420). For example, the processing logic may configure one or more switches of a programmable switched capacitor block so that the programmable switched capacitor block may provide or implement the analog function. In some embodiments, a switch may correspond to an electrical circuit component that includes two conductive pieces, referred to as contacts, that may be connected to a portion of a circuit. The contacts of the switch may touch to complete a circuit (i.e., a closed state) or the contacts of the switch may be separated to break a circuit (i.e., an open state). Accordingly, the configuring of a switch based on the analog function may determine whether a particular switch is to be in an open state or a closed state (and how long the switch is to be in either state).

Referring to FIG. 4, the processing logic may output one or more signals based on the configured switches (block 430). For example, an analog function may be implemented by the configuring of the switches and an output signal corresponding to the analog function may be provided. In some embodiments, the output signal may be based on either single ended signaling or differential signaling based on the requested analog function.

Figure 5:
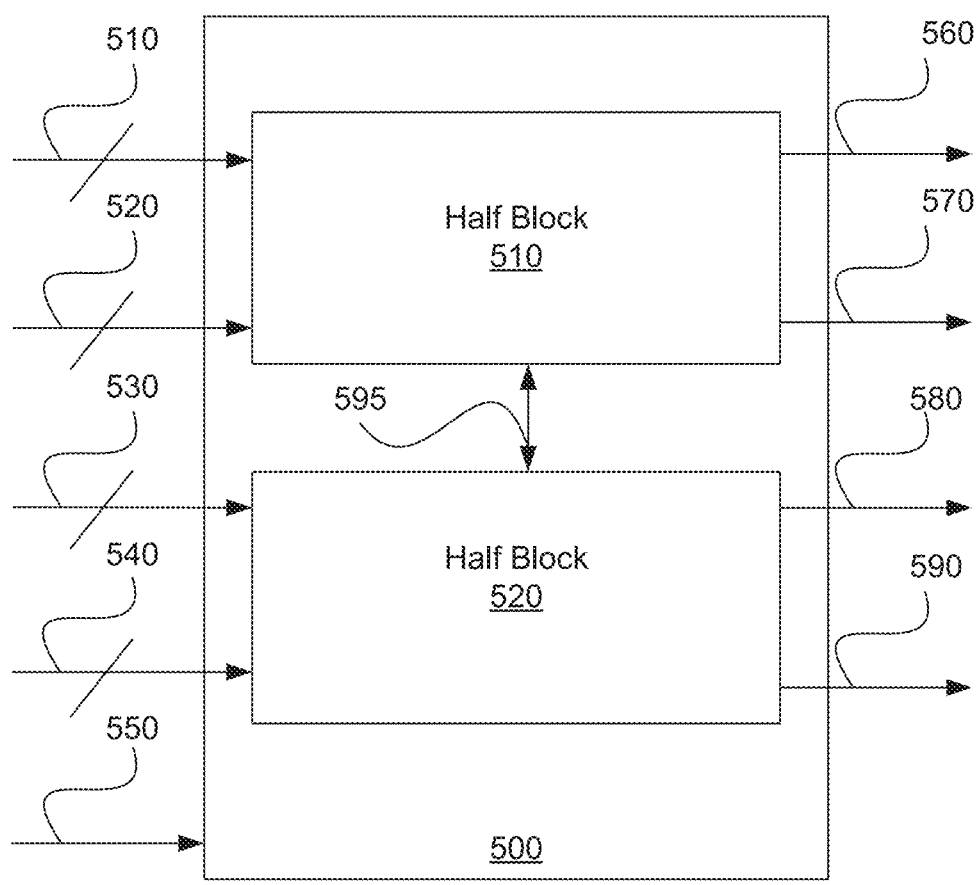
FIG. 5 is a block diagram of two half blocks of an example programmable switched capacitor block in accordance with some embodiments of the present disclosure.

FIG. 5 is a block diagram of two half blocks of an example programmable switched capacitor block 500. In general, the programmable switched capacitor block 500 may include a first half block 510 and a second half block 520 where each half block is capable of either transmitting a single ended signal or both the first half block 510 and the second half block 520 may be used to transmit a differential signal. The programmable switched capacitor block 500 may correspond to the programmable switched capacitor blocks 222 or 300 of FIGS. 2 and 3.

As shown in FIG. 5, the programmable switched capacitor block 500 includes a first half block 510 and a second half block 520. In some embodiments, each of the first half block 510 and the second half block 520 may include multiple switched capacitors, at least one operational amplifier, and at least one comparator. The first half block 510 may receive a first voltage input signals 510 and first voltage reference signals 520 and may generate the first voltage output signal 560 and the first comparator output signal 570 based on the first voltage input signals 510 and the first voltage reference signals 520. Furthermore, the second half block 520 may receive the second voltage input signals 530 and the second voltage reference signals 540 and may generate the second voltage output signal 580 and the second comparator output signal 590 based on the second voltage input signals 530 and the second voltage reference signals 540. Furthermore, the programmable switched capacitor block may receive a programming signal 550 that may be used to determine which switches to configure (e.g., open and/or close) for both the first half block 510 and the second half block 520. Additionally, a signal or wire 595 may couple or connect the first half block 510 to the second half block 520. In some embodiments, a switch in either the first half block 510 or the second half block 520 may be configured to connect or not to connect the first half block 510 to the second half block 520 based on a requested analog function to be implemented by the programmable switched capacitor block 500. Further details with regard to the switches, capacitors, operational amplifiers, comparators, and buffers of each of the first half block 510 and the second half block 520 are described in further detail with regard to FIGS. 6-8.

Figure 6:
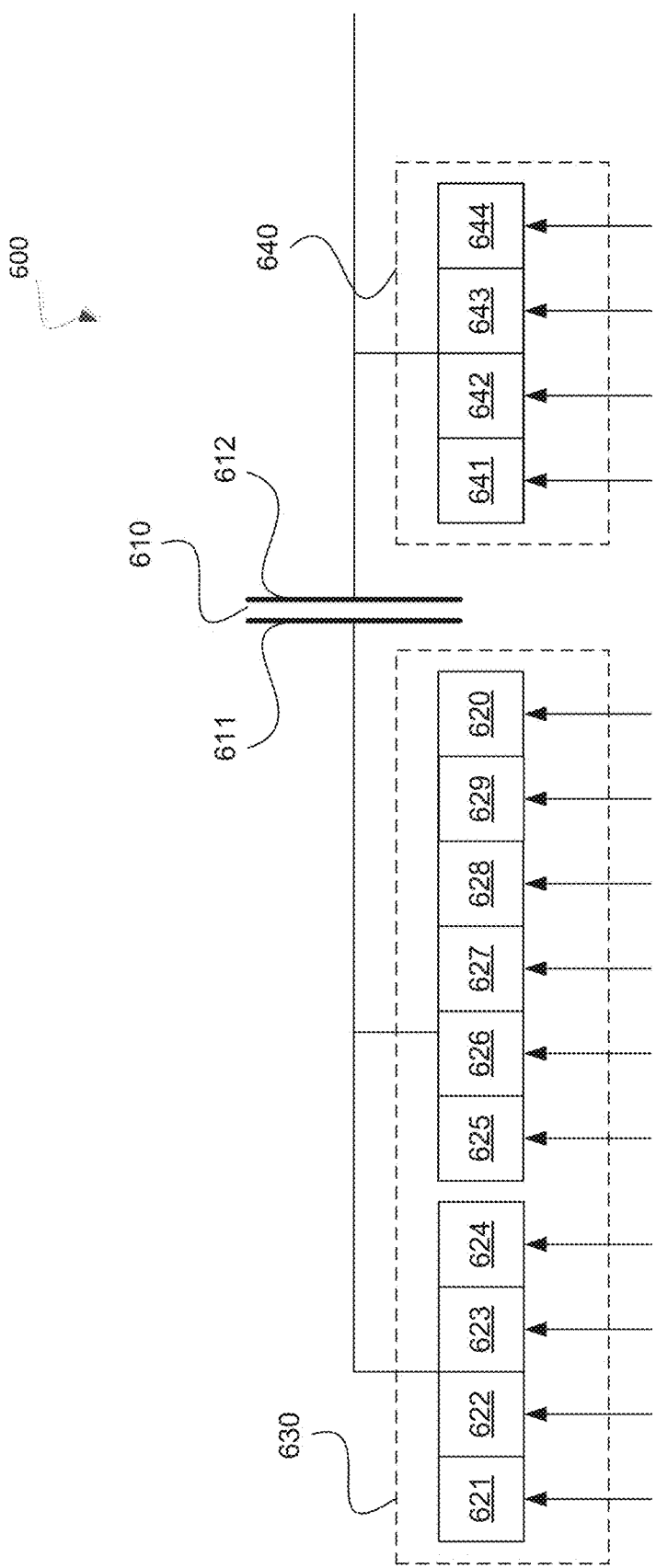
FIG. 6 is an illustration of an example switched capacitor used in the programmable switched capacitor block in accordance with some embodiments.

FIG. 6 is an illustration of an example switched capacitor 600 used in a programmable switched capacitor block. In general, the switched capacitor 600 may include a capacitor 610 and various switches that may either be opened or closed based on a requested analog function received by the programmable switched capacitor block. In some embodiments, the switched capacitor 600 may be included in the programmable switched capacitor blocks 222, 300, and 500 of FIGS. 2, 3, and 5.

As shown in FIG. 6, the switched capacitor 600 may include a capacitor 610 that includes a left side capacitor plate 611 and a right side capacitor plate 612. In some embodiments, the switched capacitor may refer to an electronic circuit element that may be used for discrete time signal processing and may be partly used to provide an analog function. The switched capacitor 600 may be used to move charge into the capacitor 610 as well as to move charge out of the capacitor 610 based on when a corresponding switch is opened and closed. In some embodiments, the switched capacitor used in a programmable switched capacitor block may include a first switch bank 630 and a second switch bank 640. The first switch bank 630 may be coupled to the left side capacitor plate 611 and the second switch bank 640 may be coupled to the right side capacitor plate 612. Furthermore, each of the first switch bank 630 and the second switch bank 640 may include multiple switches where one or more switches from each bank may be opened or closed based on an analog function that is to be implemented. For example, the first switch bank 630 may include multiple switches 620-629. In some embodiments, the switches 621-624 may correspond to input voltage signals (e.g., $V_{in00}$, $V_{in01}$, $V_{in02}$, and $V_{in03}$). The switch 625 may correspond to a $V_{out0}$ signal that may be the output of a half block of the programmable switched capacitor block that includes the switched capacitor 600. Furthermore, the first switch bank 630 may include a $V_{out1}$ signal that may correspond to a signal that may be the output of the other half block that is included in the programmable switched capacitor block. Accordingly, a switch in the first switch bank 630 may be used to connect or couple a signal from the output of a first half block to the left side capacitor plate 611 and another switch in the same first switch bank 630 may be used to connect or couple from the output of a second half block to the same left side capacitor plate 611. Furthermore, the first switch bank 630 may include a signal that corresponds to a common signal between a corresponding switched capacitor in the other half block of the programmable switched capacitor (e.g., a ComA or common A signal). The switch 628 may correspond to a $V_{ss}$ signal that may refer to a voltage source, the switch 629 may correspond to a voltage reference signal (e.g., $ref_0$), and the switch 620 may correspond another voltage reference signal (e.g., $agnd_0$ which may correspond to electrical ground).

The second switch bank 640 may be coupled to the right side capacitor plate 612. Furthermore, the second switch bank 640 may include a switch 641 corresponding to a voltage reference signal (e.g., $ref_1$), the switch 642 may correspond to electrical ground, the switch 643 may correspond to another voltage reference signal (e.g., $ref_0$), and the switch 644 may correspond to a voltage source. In some embodiments, the voltage signal ref1 may be from a buffer of a first half block that includes the switched capacitor 600 and the additional voltage reference signal may be from a buffer of a second half block that does not include the switched capacitor 600.

In operation, one or more of the switches from the first switch bank 630 may be opened and closed based on an analog function that a programmable switched capacitor block is to implement. The closing of the switch may result in charge being moved into the capacitor 610. Furthermore, in some embodiments, one or more of the switches from the second switch bank 640 may be used to transfer or move the charge from the capacitor 610 to a negative terminal of an operational amplifier (opamp).

In some embodiments, the various switches may include, but are not limited to, complementary metal-oxide-semiconductor (CMOS) switches, pumped switches, and a t-switch. Accordingly, in some embodiments, the switch banks 630 and 640 may each include one or more different types of switches. For example, a type of switch may be used based on the signal that the switch corresponds to. For example, a CMOS switch or a T-switch may be used for a signal that requires a rail to rail transition (e.g., a sine wave based signal that goes from an upper range to a lower range) and the pumped switch may be used for a signal that corresponds to ground or 0 volts.

As will be described in further detail with regard to FIG. 7, a programmable switched capacitor block may include two half blocks, each of which includes multiple capacitor branches. Each of the capacitor branches may include multiple programmable switched capacitors. As an example, each half block of the programmable switched capacitor block may include three capacitor branches and each of the capacitor branches may include six switched capacitors.

Figure 7A:
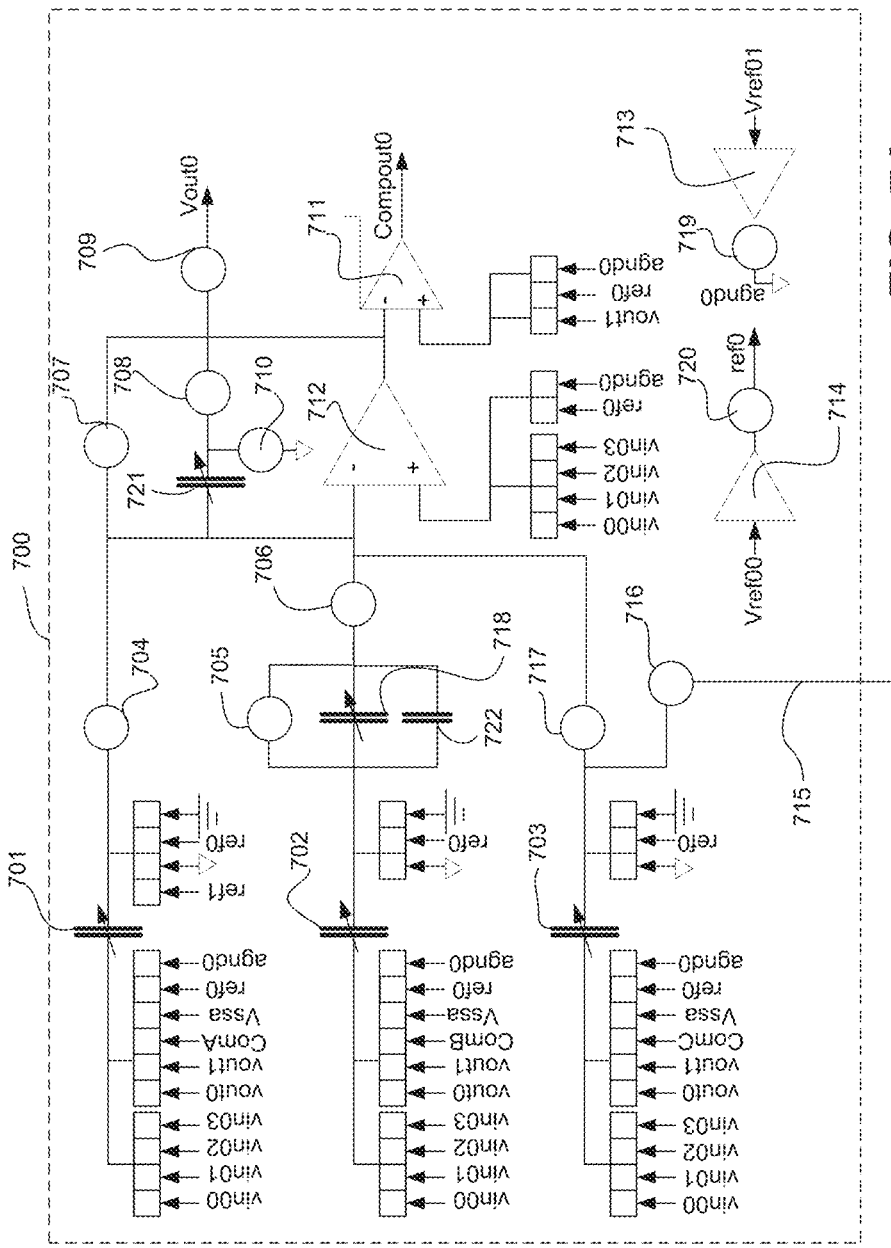
FIG. 7A is a block diagram of an example half block of a programmable switched capacitor block in accordance with some embodiments of the present disclosure.

FIG. 7A is a block diagram of an example half block 700 of a programmable switched capacitor block. In general, the programmable switched capacitor block 700 may include two half block that each include three capacitor branches. The half block 700 may correspond to one of the half blocks 510 or 520 of FIG. 5.

As shown in FIG. 7A, the half block 700 may include multiple switched capacitors (e.g., as described with regard to FIG. 6). For example, the half block 700 may include three capacitor branches where each capacitor branch includes multiple switched capacitors. For example, capacitors 701 may be part of a first capacitor branch (e.g., Branch A), the capacitors 702 may be part of a second capacitor branch (e.g., Branch B), and the capacitors 703 may be part of a third capacitor branch (e.g., Branch C). As shown, each of the switched capacitors in each of the capacitor branches includes a first switch bank and a second switch bank as previously described. In some embodiments, the inputs to each switch of the switch banks may be similar for each of the capacitor branches, but one signal in the first switch bank may differ between the capacitor branches of a half block. For example, as shown, the first branch is associated with a signal "ComA" (also referred to as a Common A signal), the second branch is associated with a signal "ComB," and the third capacitor branch is associated with a signal "ComC." In some embodiments, each of the ComA, ComB, and ComC signals may be a same signal as an input signal to another first switch bank of a corresponding capacitor branch in the other half block of the programmable switched capacitor block. For example, a first capacitor branch of a first half block may have one switch in its first switch bank that includes an input to a switch that is coupled to the ComA signal and the first capacitor branch of the second half block may also have one switch in its first switch bank that also includes an input to a switch that is coupled to the same ComA signal. Accordingly, one of the signals in each first switch bank of a first half block may be the same signal as one of the signals in a corresponding first switch bank of the second half block.

Referring to FIG. 7A, the half block 700 may further include multiple switches. For example, the half block 700 may include switches 704, 705, 706, 707, 708, 709, 710, 716, 717, 718, 719, and 720. Each of the switches may be opened and/or closed based on an analog function that is to be implemented, a number of bits that are to be output, and/or whether the analog function that is to be implemented is based on single ended signaling or differential signaling. For example, the switches 704, 706, and 717 may be used to transfer a charge from a capacitor in a capacitor branch to the negative terminal of the operational amplifier (op-amp) 712. As an example, if the switch 704 is closed, then the charge from the capacitors 701 may be transferred to the negative terminal of the op-amp 712. Similarly, if the switches 706 and 717 are closed, then the charge from the capacitors 702 and 703 may be moved from the capacitors 702 and the capacitors 703 to the negative terminal of the op-amp 712.

The half block 700 may further include op-amp 712, comparator 711, capacitor 721, and buffers 713 and 714. In some embodiments, the buffers 713 and 714 may be used to buffer an input reference voltage that is used for outputting a single ended signal. The buffer 713 may receive a first reference voltage signal and the buffer 714 may receive a second reference voltage signal. The negative terminal of the op-amp 712 may be coupled to receive charge from any of the capacitors 701, 702, and 703 and the positive terminal of the op-amp 712 may be coupled to additional switches. For example, the positive terminal of the op-amp 712 may be coupled to switches coupled to input voltage signals (e.g., $V_{in00}$, $V_{in01}$, $V_{in02}$, and $V_{in03}$) as well as switches coupled to a first voltage reference signal (e.g., an output from the buffer 714) and a second voltage reference signal (e.g., an output from the buffer 713). Furthermore, the output of the op-amp 712 may be coupled to the negative terminal of the comparator 711 and the positive terminal of the comparator 711 may be coupled to additional switches. For example, the positive terminal of the comparator 711 may be coupled to switches that are associated with the first and second voltage reference signals and the output voltage signal of the second half block. Accordingly, the negative terminal of the comparator 711 may receive the output voltage signal of the first half block that includes the comparator 711 and the positive terminal of the comparator 711 may receive the output voltage signal of a second half block that does not include the comparator 711 if a particular switch that is coupled to the positive terminal of the comparator 711 is closed.

Referring to FIG. 7A, the capacitor 721 may be referred to as a feedback capacitor that may store charge for the output voltage signal. The switch 710 may be used to discharge the capacitor (e.g., by the closing of the switch). Furthermore, the switches 707 and 708 may both be simultaneously closed to remove the charge from the capacitor 721. Alternatively, the switches 708 and 709 may be simultaneously closed to transfer charge from the capacitor 721 to the output voltage signal. Furthermore, the half block 700 may include an attenuation capacitor 722 and a series capacitor 718. In some embodiments, the first capacitor branch and the second capacitor branch, each of which are associated with six bits, may be combined to implement the functionality of a twelve bit capacitor by the use of the attenuation capacitor 722. Accordingly, if an analog function that is to be implemented requires a twelve bit capacitor, the first capacitor branch and the second capacitor branch of a half block may be combined by the use of an attenuation capacitor 722 that is included in the second capacitor branch. For example, if the attenuation capacitor 722 is not to be used (e.g., bits from a first capacitor branch are not to be combined with bits from a second capacitor branch), then the switch 705 may be closed to remove the effect of the attenuation capacitor 722 and if the attenuation capacitor 722 is to be used (e.g., bits from the first capacitor branch are to be combined with bits from the second capacitor branch), then the switch 705 may be opened so that the effect of the attenuation capacitor 722 is not removed. Accordingly, a switch may be opened if bits from capacitors from different capacitor branches are to be combined and the same switch may be closed if bits from capacitors from different capacitor branches are not to be combined. In some embodiments, the attenuation capacitor may be included in each of the multiple branches of each of the half blocks.

The half block 700 may further include switch 716 so that the third capacitor branch may be used in the other half block of the programmable switched capacitor block that includes the half block 700. For example, if a requested analog function that is to be implemented by the programmable switched capacitor block requires four capacitor branches to implement the analog function, then the switch 716 may be closed to connect the capacitor of a capacitor branch from the second half block to the negative terminal of the op-amp 712 and/or capacitor 721.

As such, a half block of a programmable switched capacitor block may include multiple capacitor branches, an operational amplifier, and a comparator. The capacitor branches may be associated with multiple switches where one switch coupled to the left side capacitor plate of each capacitor may be associated with a signal that is the same as another switched that is coupled to the left side capacitor plate of the other half block of the programmable switched capacitor. Furthermore, the negative terminal of the operational amplifier may receive a charge from the capacitors of one or more capacitor branches and the positive terminal of the operational amplifier may be coupled to multiple switches. The switches coupled to the positive terminal of the operational amplifier may connect a first and/or second reference signal to the positive terminal of the operational amplifier. Furthermore, the negative terminal of the comparator may receive the output of the operational amplifier and the positive terminal of the comparator may be coupled to multiple switches where one of the switches is the output voltage signal of the other half block and at least two of the other switches are used to connect the first and second reference voltage signals to the positive terminal of the comparator.

Figure 7B:
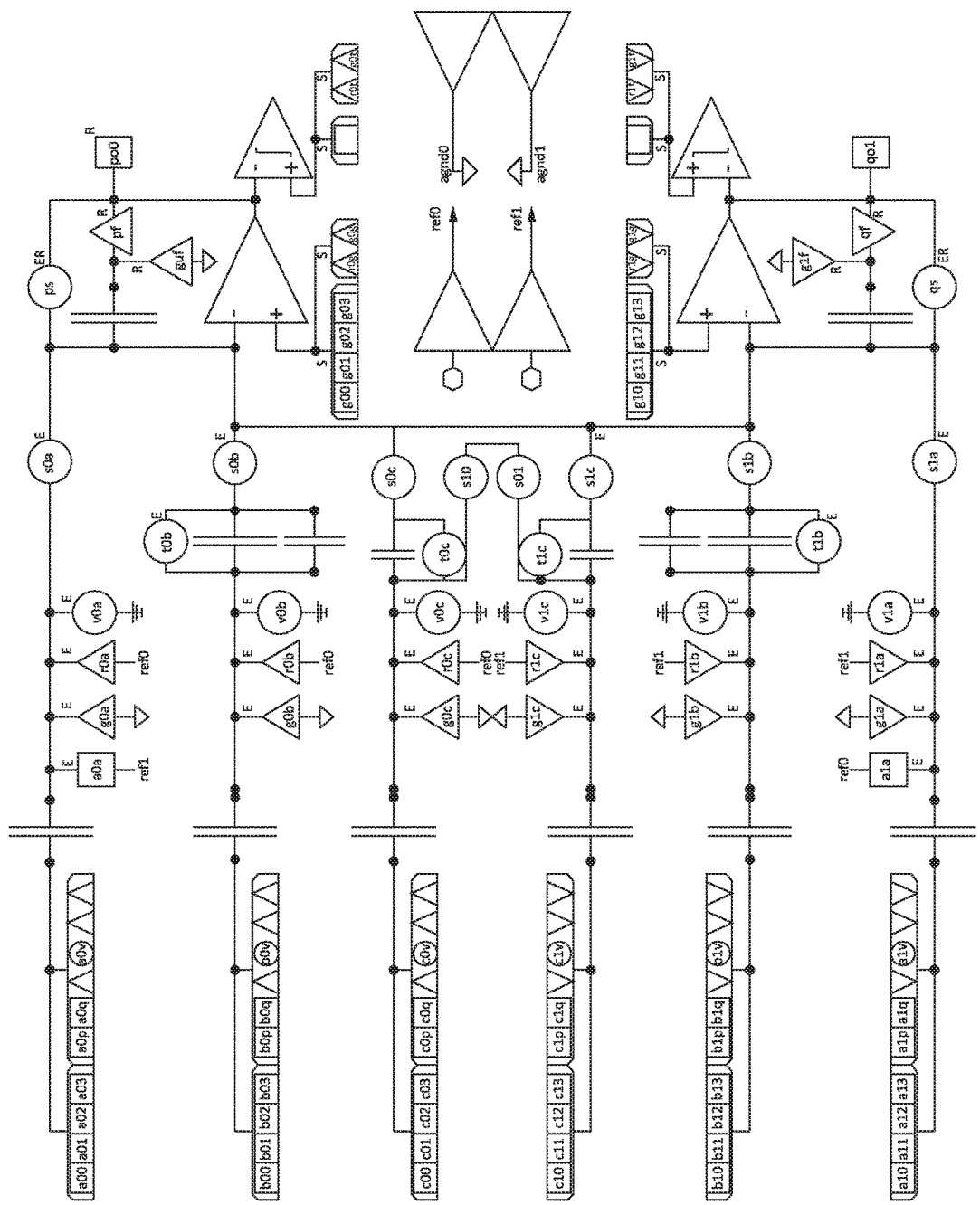
FIG. 7B is a block diagram of an example programmable switched capacitor block in accordance with some embodiments of the present disclosure.

FIG. 7B is a block diagram of an example programmable switched capacitor block 750. In general, the programmable switched capacitor block 750 may include a first half block 730 and a second half block 740 that may each be used to implement a separate analog function based on a single ended signal or may both be used to implement an analog function based on a differential signal. The programmable switched capacitor block may correspond to the programmable switched capacitor blocks 300 or 500 of FIGS. 3 and 5. The first half block 730 may correspond to the half block 700 of FIG. 7A.

As shown in FIG. 7B, the programmable switched capacitor block 750 may include a first half block 730 and a second half block 740. Each of the first half block 730 and the second half block 740 may include similar components or structure. For example, each of the half blocks may include multiple capacitor branches, an operational amplifier, a comparator, buffers, and various switches. The capacitor branches of the first half block may include switches that may be closed to couple a signal from a first group of voltage input signals (e.g., $V_{in00}$, $V_{in01}$, $V_{in02}$, and $V_{in03}$) to a left side capacitor plate and the capacitor branches of the second half block may include switches that may be closed to couple a signal from a second group of voltage signals (e.g., $V_{in10}$, $V_{in11}$, $V_{in12}$, and $V_{in13}$) to a left side capacitor plate. Additionally, the first branch of the first half block 730 and the first branch of the second half block 740 may each include a common signal (e.g., ComA) that may be coupled to the left side capacitor plate if a particular switch is closed. Furthermore, the positive terminal of each operational amplifier may include switches that may couple the same reference voltages to each operational amplifier of the first half block 730 and the second half block 740. For example, the positive terminal of the operational amplifier from the first half block 730 may be coupled to switches that may be used to connect any of the first group of voltage input signals and additional switches to connect the first and second reference voltage signals to the positive terminal of the operational amplifier. Furthermore, the positive terminal of the operational amplifier from the second half block 740 may be coupled to switches that may be used to connect any of the second group of voltage input signals to the positive terminal of the operational amplifier as well as additional switches that may be used to connect the same first and second reference voltage signals to the positive terminal of the operational amplifier. Accordingly, the positive terminal of both operational amplifiers from each of the half blocks may be configured to receive the same voltage reference signal.

Furthermore, as shown, the output voltage of the first half block 730 may be received by the positive terminal of the comparator of the second half block 740 by closing a particular switch and the output voltage of the second half block 740 may be received by the positive terminal of the comparator of the first half block 730 by the closing of another switch.

Referring to FIG. 7B, the programmable switched capacitor block 750 may include two sets of reference buffers (e.g., a first pair of buffers for the first half block 730 and a second pair of buffers for the second half block 740). In some embodiments, each of the pair of reference buffers may receive different input signals so that two dissimilar single ended signals associated with two different analog functions may be implemented by the programmable switched capacitor block 750. For example, the first half block 730 may have a first reference voltage and a first analog ground voltage and the second half block 740 may have a second reference voltage and a second analog ground voltage. Accordingly, the programmable switched capacitor block may support two different analog functions requiring different single ended signals that operate at different reference and ground voltages.

Figure 8:
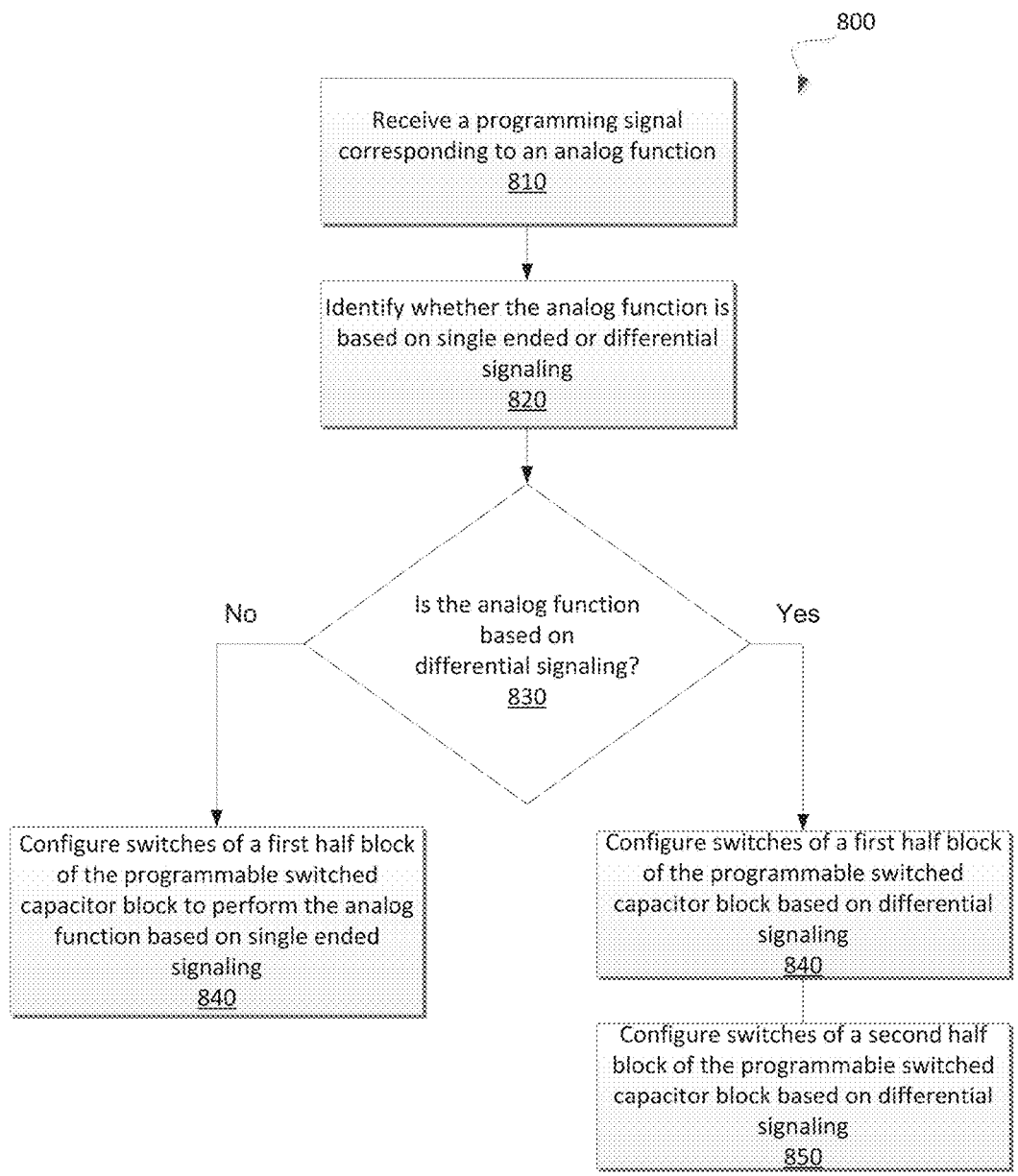
FIG. 8 is a flow diagram of an example method to configure a programmable switched capacitor block based on single ended signal or differential signal functionality associated with an analog function in accordance with some embodiments.

FIG. 8 is a flow diagram of an example method 800 to configure a programmable switched capacitor block based on single ended signal or differential signal functionality associated with an analog function. The method 800 may be performed by processing logic that may include hardware (circuitry, dedicated logic, etc.), software (such as is run on a computing system or a dedicated machine), firmware (embedded software), or any combination thereof. In some embodiments, the method 800 may be performed by the programmable switched capacitor blocks 222, 300, or 500 of FIGS. 2, 3, and 5. For example, the method 800 may be performed by processing logic (e.g., hardware, circuitry, etc.) of a programmable switched capacitor block or a processing device coupled to the programmable switched capacitor block.

As shown in FIG. 8, the method may begin by processing logic receiving a programming signal corresponding to an analog function (block 810). Examples of an analog function include, but are not limited to, discrete time analog functions such as a $1^{st}$ order sigma delta modulator of variable resolution, a second order sigma delta modulator, incremental and/or continuous time functions, a variable again analog to digital converter (ADC), a variable resolution digital to analog converter (DAC) and a multiplying DAC, a variable gain DAC, an automatic gain control in ADC and DAC modes, a programmable gain amplifier, a sub-sampling mixer, a $1^{st}$ order filter, a higher order filter associated with chaining, a $1^{st}$ order differential signal path, a higher order differential signal path associated with chaining, a $2^{nd}$ order single ended signal, time interleaved differencing operations, modulation of analog input signals, a track and hold amplifier, a sample and hold amplifier, differential to single ended signal conversion, relaxation oscillator, a two-phase or three phase control or sampling system with an adjustable sample aperture, various filters associated with a biquad mode, an adjustable Return to Zero signal for low offset outputs, a self-testing function, a summer, an integrator, and a clocked comparator. The processing logic may further identify whether the analog function is based on single ended or differential signaling (block 820). For example, the processing logic may identify whether the analog function requires an output signal to be a single ended signal or requires the output signal to be a differential signal. Accordingly, the processing logic may determine whether the analog function is based on differential signaling (block 830). If the analog function is not based on differential signaling (e.g., the output of the analog function is to be a single ended signal), then the processing logic may configure switches of a first half block of the programmable switched capacitor block to perform the analog function based on the single ended signaling (block 830). For example, the switches of the first half block of the programmable switched capacitor may be opened and/or closed to output a single ended signal based on the analog function and the second half block of the same programmable switched capacitor may not be configured based on the analog function. However, if the analog signal is based on differential signaling, then the processing logic may configure switches of the first half block of the programmable switched capacitor block based on the differential signaling (block 840) as well as configure the switches of the second half block of the same programmable switched capacitor block based on the differential signaling (block 850).

In some embodiments, when the analog function is based on the single ended signaling, then only one half block of the programmable switched capacitor block may be used to implement the analog function. Furthermore, the comparator of the half block that is used may not receive the output voltage signal of the other half block of the programmable switched capacitor block. Additionally, the other half block that is not used from the same programmable switched capacitor block may be used to implement another analog function. Accordingly, each half block may independently implement different analog functions that are each based on single ended signaling. However, when the analog function is based on differential signaling, then both half blocks of the same programmable switched capacitor block may be used to implement the analog function that is based on differential signaling. For example, the positive terminal of op-amps from both of the half blocks may be connected to the same reference voltage signal by the closing of respective switches. Furthermore, the same signal may be connected to the left side capacitor plate of each capacitor in a particular capacitor branch in each of the half blocks. For example, a first switch may be closed to connect a first signal to the left side capacitor plate in a first branch of the first half block and a second switch may be closed to connect the same first signal to the left side capacitor plate in a first branch of the second half block. Similarly, a second signal may be connected to the left side capacitor plate in a second branch of the first half block and the second branch of the second half block. In operation, the differential signaling may be accomplished by sampling an input voltage signal (e.g., $Vi_{n00}$ for the first half block and $V_{in10}$ for the second half block) and closing a switch to couple the same signal (e.g., the ComA signal) to the left side capacitor plate in each of the first half block and the second half block. In some embodiments, any asymmetry in the sampling of the input voltage signals (e.g., between the input voltage signal for the first half block and the input voltage signal for the second half block) may be negated by equally distributing the charge to the capacitors in both the first half block and the second half block. Accordingly, the differential signaling may be implemented by configuring switches in both the first half block and the second half block so that a positive terminal of op-amps in each of the first half block and second half block are connected to the same reference voltage signal and the left side capacitor plates of corresponding capacitors in corresponding capacitor branches are connected to at least one other same signal.

The embodiments described herein may be used to provide a programmable switched capacitor block that may be used to implement various analog functions. The use of the programmable switched capacitor block may improve the flexibility of an analog subsystem used in a processing device and may provide a higher amount of potential functionality within the same silicon area as opposed to having multiple fixed functional analog blocks each dedicated to a particular analog function. The programmable switched capacitor block may include multiple switches that may be programmed or configured to perform different analog functions based on the switches that are programmed or configured to be opened and/or closed. The programming of the programmable switched capacitor block may be set using various techniques, such as firmware executing on a microcontroller unit.

Applications of the Programmed Switched Capacitor Block

The programmable switched capacitor block may further include a multi-level comparator. In some embodiments, each half block of the programmable switched capacitor block may include a multi-level comparator. For example, the comparator 711 of FIG. 7A may be implemented as a multi-level comparator. In some embodiments, the multi-level comparator may receive an input voltage and may compare the input voltage to multiple reference threshold voltages. The outputs of the multi-level comparator may indicate whether the input voltage is larger or smaller than multiple reference threshold voltages. As an example, the multi-level comparator may compare the input voltage to a first reference threshold voltage and a second reference threshold voltage. The multi-level comparator may provide a first output signal to indicate whether the input voltage is larger or smaller than the first reference threshold voltage and a second output signal to indicate whether the same input voltage is larger or smaller than the second reference threshold voltage. The multi-level comparator may include additional output signals for a comparison of the input voltage with each subsequent reference threshold voltage. Further details with regard to the multi-level comparator are described in conjunction with FIGS. 9A-9B.

The use of the multi-level comparator in the programmable switched capacitor block as previously described may provide for additional functionality for the programmable switched capacitor block. For example, the multi-level comparator may enable the programmable switched capacitor block to provide such analog functions as a sigma-delta analog to digital converter (ADC) function, delta-sigma digital to analog converter (DAC) function, oscillator function, median filter function, an adaptive filter function, zoom ADC function, in a multi-stage noise shaping (MASH) architecture, and so forth as described in conjunction with FIGS. 10-19. In some embodiments, the programmable switched capacitor block may be used to provide an operation associated with one of the functions described above.

Furthermore, in some embodiments, the programmable switched capacitor block may be implemented so that a component or resource from one programmable switched capacitor block may be used with a second programmable switched capacitor block. For example, any capacitor, switch, amplifier, comparator, reference voltage, or other such component, input, or output of one programmable switched capacitor block may be shared for use in another programmable switched capacitor block via a bus or floating connection between the programmable switched capacitor blocks. For example, a bus or interconnect between a first portion and a second portion (or half block) of the programmable switched capacitor block may provide a use of a component or output from the first portion to the second portion of the programmable switched capacitor block.

Figure 9A:
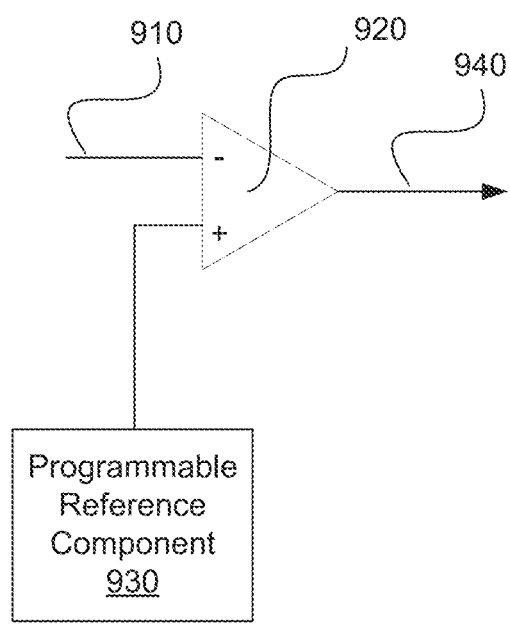
FIG. 9A is a block diagram of an example multi-level comparator used in a programmable switched capacitor block in accordance with some embodiments.

FIG. 9A is a block diagram of an example multi-level comparator 920 used in a programmable switched capacitor block. In general, the multi-level comparator 920 may correspond to the comparator 711 of a half block 700 of a programmable switched capacitor block of FIG. 7A.

As shown in FIG. 9A, the multi-level comparator 920 may receive an input voltage 910 and compare the input voltage 910 with a reference threshold voltage from a programmable reference component 930. For example, at a first time, the programmable reference component 930 may generate a first reference threshold voltage and the comparator 920 may provide an output 940 that indicates whether the input voltage 910 is larger or smaller than the first reference threshold voltage. At a second time, the programmable reference component 930 may generate a second reference threshold voltage and the comparator 920 may change the output 940 to indicate whether the input voltage 910 is larger or smaller than the second reference threshold voltage. As such, a single comparator configured to receive different reference threshold voltages may be used to provide a multi-level comparator functionality.

Figure 9B:
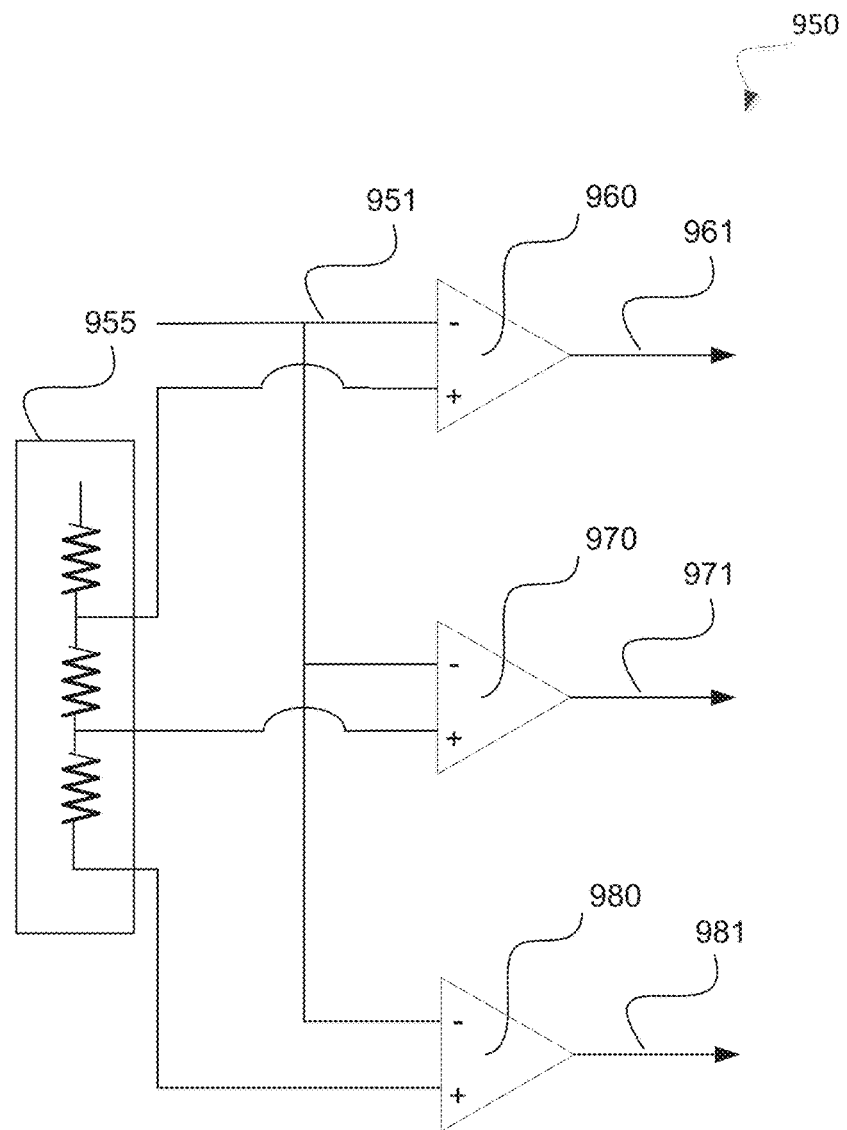
FIG. 9B is a block diagram of another example multi-level comparator used in a programmable switched capacitor block in accordance with some embodiments.

FIG. 9B is a block diagram of another example multi-level comparator 950 used in a programmable switched capacitor block. In general, the multi-level comparator 950 may correspond to the comparator 711 of a half block 700 of a programmable switched capacitor block of FIG. 7A.

As shown in FIG. 9B, the multi-level comparator 950 may correspond to a bank or series of comparators. For example, the bank of comparators may include a first comparator 960, a second comparator 970, and a third comparator 980. Each of the comparators 960, 970, and 980 may receive the same input voltage 951 and a different reference threshold voltage based on a resistance ladder 955. In some embodiments, the resistance ladder 955 may be a series of resistors that are connected between two reference voltages. The resistors of the resistance ladder 955 may function as voltage dividers between the referenced voltages so that a voltage between two resistors of the resistance ladder 955 may generate a different voltage. For example, the first comparator 960 may receive a first reference threshold voltage to generate the first output 961 based on a comparison with the input voltage 951, the second comparator 970 may receive a second reference threshold voltage to generate the second output 971 based on a comparison of the input voltage 951 with the second reference threshold voltage, and the third comparator 980 may receive a third reference threshold voltage to generate the third output 981 based on a comparison of the input voltage 951 with the third reference threshold voltage.

As such, the multi-level comparator used in a programmable switched capacitor block may include a comparator bank corresponding to multiple comparators and a resistance ladder to provide different reference threshold voltages to each comparator of the comparator bank.

Figure 10:
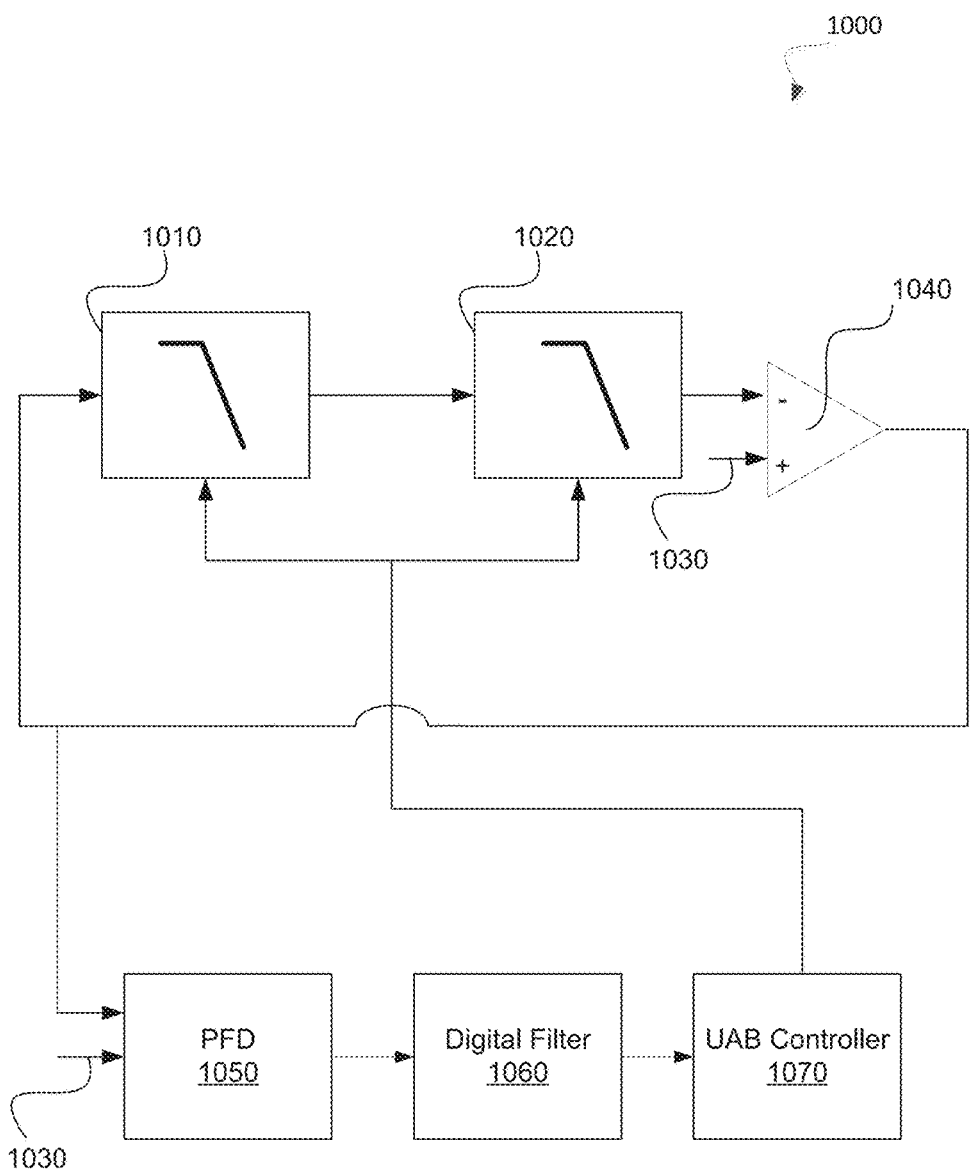
FIG. 10 is a block diagram of a programmable switched capacitor block functioning as an oscillator in accordance with some embodiments of the present disclosure.

FIG. 10 is a block diagram of a programmable switched capacitor block functioning as an oscillator 1000. In general, the oscillator 1000 may be implemented based on the programmable switched capacitor blocks 222, 300, or 500 of FIGS. 2, 3, and 5.

As shown in FIG. 10, an oscillator 1000 may be implemented based on a programmable switched capacitor block. The oscillator 1000 may be implemented with the programmable switched capacitor block programmed to perform functions corresponding to an integrator 1010 and an integrator 1020. The oscillator 1000 may be a loop oscillator based on the integrators 1010 and 1020 and an output of the multi-level comparator 1040 that receives a reference threshold voltage 1030. The integrators 1010 and 1020 may be modified based on a universal analog block (UAB) controller 1070. For example, the output of the multi-level comparator 1040 may be received by a phase frequency detector (PFD) 1050 that also receives the reference threshold voltage 1030. The output of the PFD 1050 may be received by a digital filter 1060 with an output to the UAB controller 1070. The UAB controller 1070 may thus provide configuration signals to change the programmable switched capacitor (e.g., to change programmable capacitances or the operation of switches) based on phases of the reference threshold voltage 1030 and the output of the multi-level comparator 1040. In some embodiments, oscillator 1000 may perform functions corresponding to a digital phase lock loop (DPLL).

Figure 11:
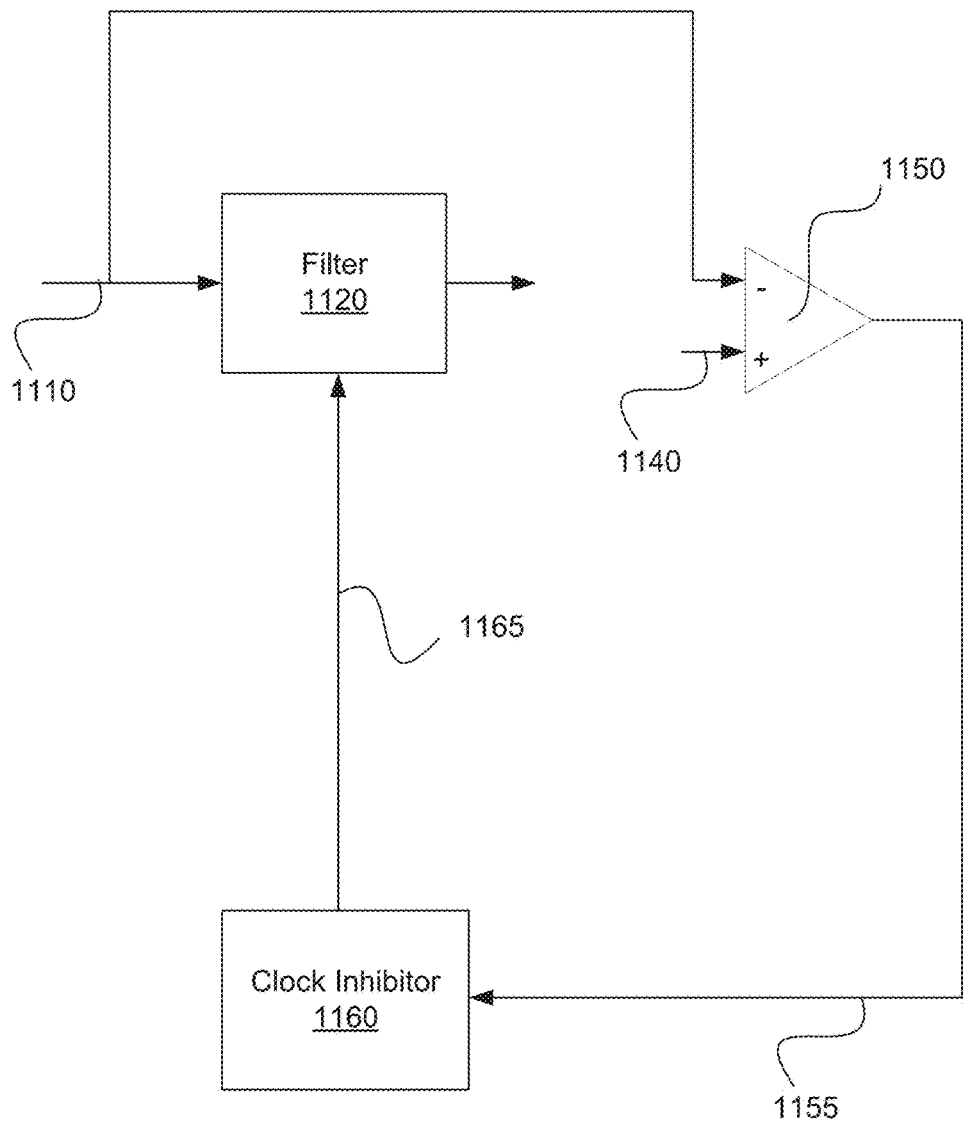
FIG. 11 is a block diagram of a programmable switched capacitor block functioning as a median filter in accordance with some embodiments of the present disclosure.

FIG. 11 is a block diagram of a programmable switched capacitor block functioning as a median filter. In general, the median filter 1120 may be implemented based on the programmable switched capacitor blocks 222, 300, or 500 of FIGS. 2, 3, and 5.

As shown in FIG. 11, a median filter 1120 may be implemented based on a programmable switched capacitor block. For example, the median filter 1120 may generate an output based on an input 1110. The output of the median filter may correspond to a removal of noise from the input 1110. Furthermore, the input 1110 to the median filter 1120 may also be received by a multi-level comparator 1150 that compares the input 1110 to a reference threshold voltage 1140. The output 1155 of the multi-level comparator 1150 may be received by a clock inhibitor component 1160 that generates a control signal 1165 that configures the median filter 1120 (i.e., configures the programmable switched capacitor block that provides the median filter functionality). In some embodiments, large and small samples may be rejected by inhibiting a clock signal used by the programmable switched capacitor block that implements the median filter 1120. Thus, the multi-level comparator 1150 may be used to create a control signal that changes the clock signal of a programmable switched capacitor block so that the frequency response of the median filter 1120 changes in response to the control signal 1165. Thus, the median filter 1120 may be a band pass filter that is based on the output of the comparator 1150 that compares the input 1110 to the median filter 1120 to a reference threshold voltage 1140.

In some embodiments, the output of a multi-level comparator may be used as a clock source for a filter or other such function provided by a programmable switched capacitor block. For example, the output of the multi-level comparator may be used to determine when a filter (e.g., the filter 1120) may sample an input signal (e.g., by closing switches of the programmable switched capacitor block).

Figure 12:
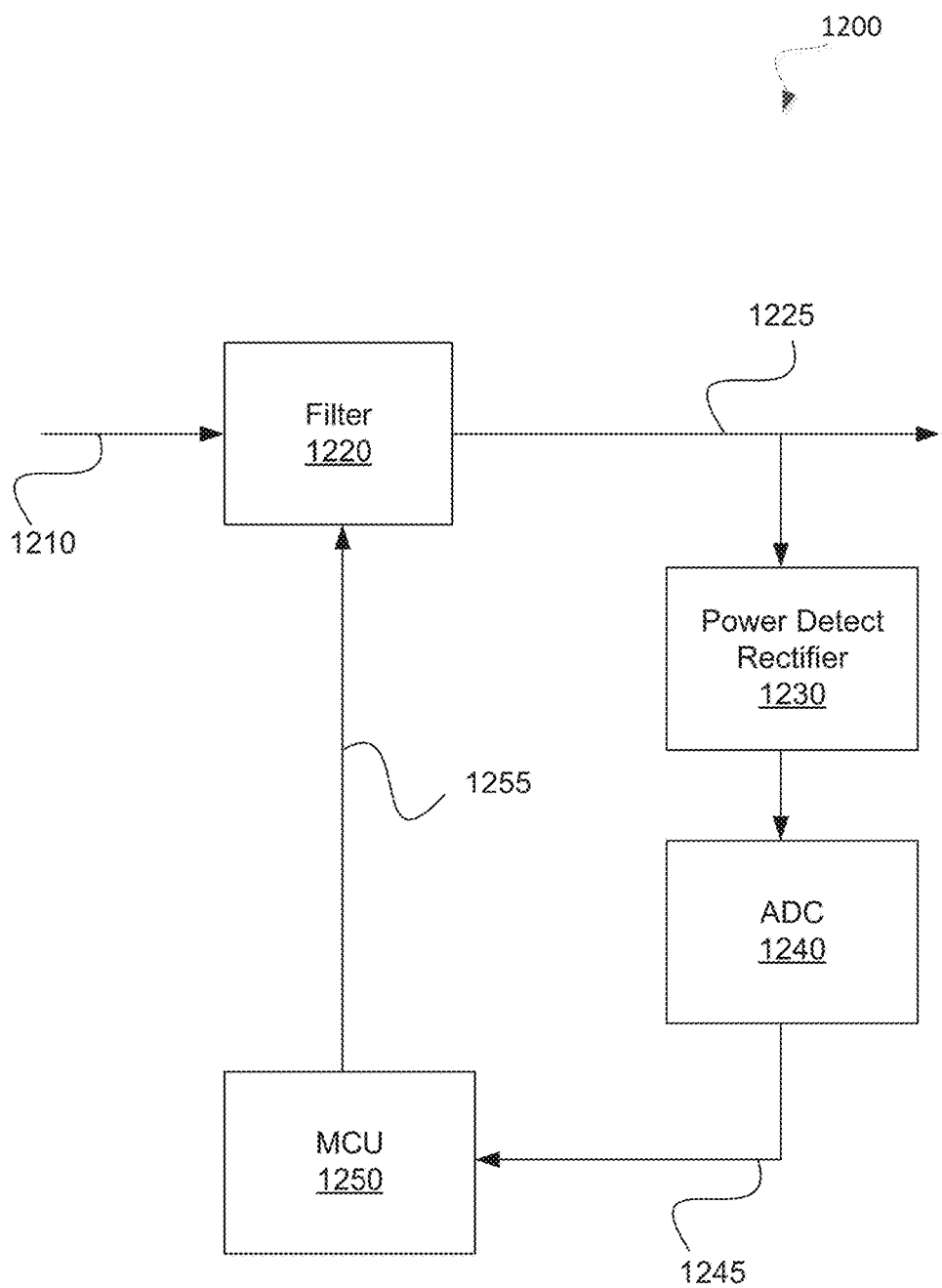
FIG. 12 is a block diagram of a programmable switched capacitor block functioning as an adaptive signal processor in accordance with some embodiments of the present disclosure.

FIG. 12 is a block diagram of a programmable switched capacitor block functioning as an adaptive signal processor for a filter. In general, a filter 1220 that is adaptively configured may be implemented based on the programmable switched capacitor blocks 222, 300, or 500 of FIGS. 2, 3, and 5.

As shown in FIG. 12, a filter 1220 may receive an input 1210 and a control signal 1255 that provides an adaptive control of the filter 1220. The filter 1220 may generate an output 1225. Furthermore, a power detect rectifier 1230 may receive the output 1225 from the filter and may provide an input to an analog to digital converter 1240. The digital output 1245 from the ADC 1240 may be received by a microcontroller unit (MCU) 1250 that generates the control signal 1255 based on the digital output 1245. In some embodiments, the filter 1220 may be implemented by a first half block of a programmable switched capacitor block and the power detect rectifier 1230 and ADC 1240 may be implemented by a second half block of the programmable switched capacitor block.

The control signal 1255 may control the frequency and program the programmable capacitors of the half block of the programmable switched capacitor block that is used to implement the filter 1220. For example, the response of the filter 1220 may be changed based on the control signal 1255. Thus, a first half block of a programmable switched capacitor block may be used to implement the filter 1220 and the second half block of the programmable switched capacitor block may be used to analyze the output of the filter 1220 and to provide a signal that is used to adaptively control the filter 1220.

Figure 13:
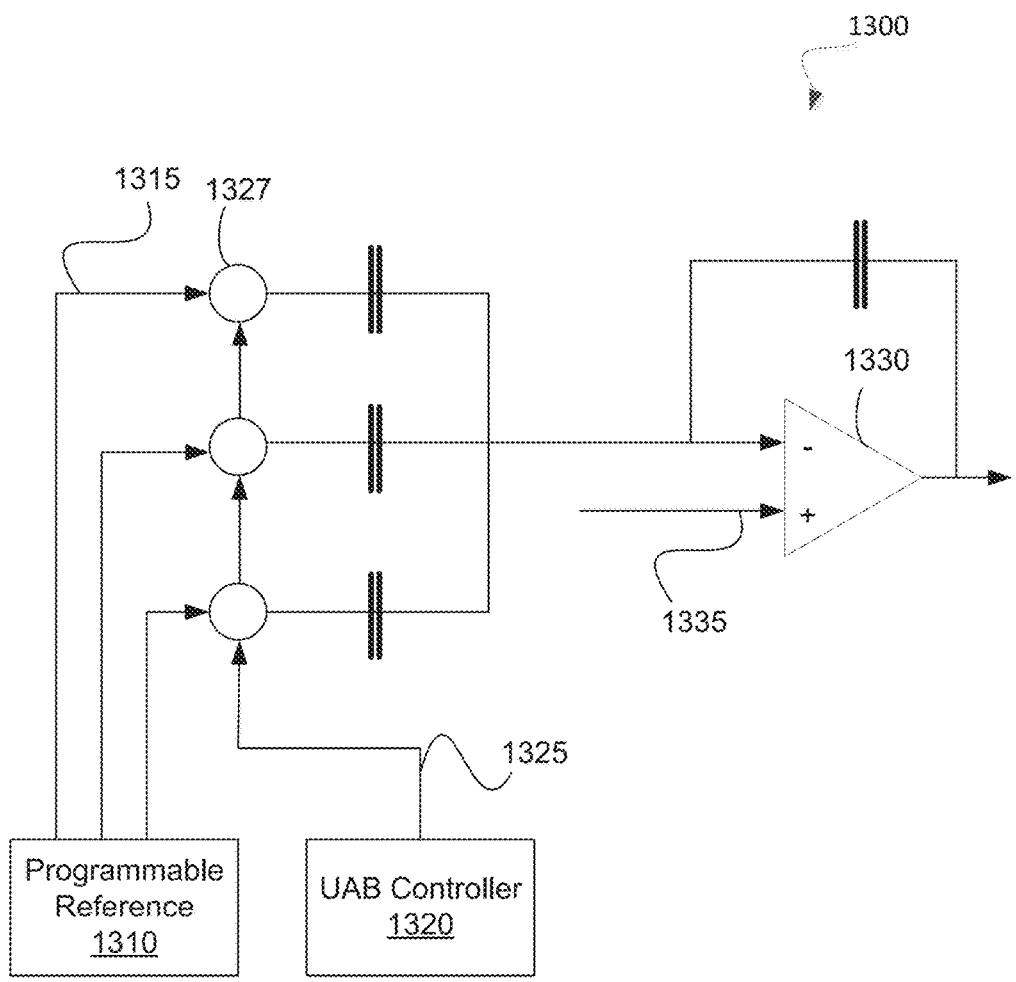
FIG. 13 is a block diagram of a programmable switched capacitor block functioning as delta-sigma digital to analog converter in accordance with some embodiments of the present disclosure.

FIG. 13 is a block diagram of a programmable switched capacitor block functioning as delta-sigma digital to analog converter 1300. In general, the delta-sigma DAC 1300 may be implemented based on the programmable switched capacitor blocks 222, 300, or 500 of FIGS. 2, 3, and 5.

As shown in FIG. 13, the delta-sigma DAC 1300 may be implemented with a multi-level comparator 1330 that compares a reference threshold voltage with an input voltage 1335. For example, as previously described, components or resources may be shared between programmable switched capacitor blocks. Multiple reference threshold voltages may thus be received where one of the reference threshold voltages is from another programmable switched capacitor block. For example, a programmable reference 1310 may be used to provide multiple reference threshold voltages 1315 to be used as a reference threshold voltage for comparison with the input voltage 1335 by the comparator 1330. The UAB controller 1320 may control the operation of switches 1327 based on the control signal 1325. For example, one of the switches 1327 may be operated to provide one of the reference threshold voltages 1315 to be used as the reference threshold voltage by the comparator 1330.

Figure 14:
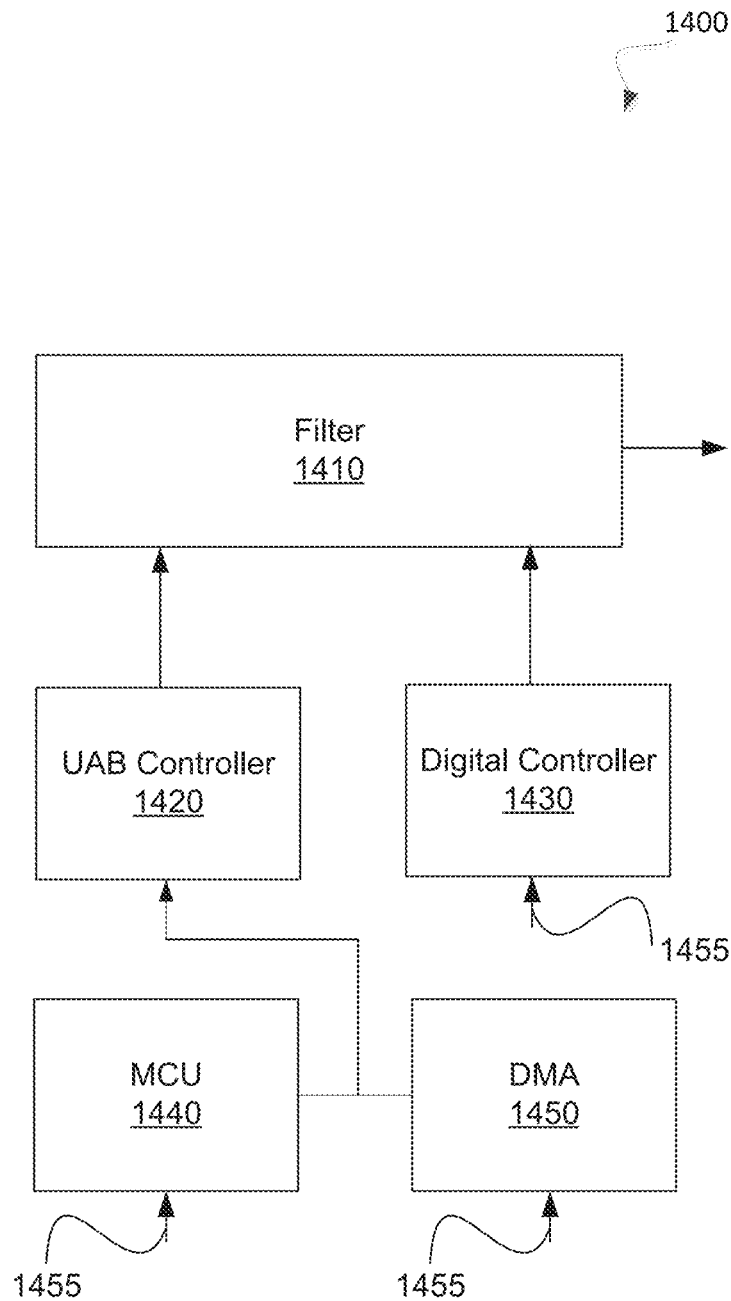
FIG. 14 is a block diagram of a system to configure a programmable switched capacitor block in accordance with some embodiments of the present disclosure.

FIG. 14 is a block diagram of a system 1400 to configure a programmable switched capacitor block. In general, the system 1400 includes a filter 1410 that is implemented based on the programmable switched capacitor blocks 222, 300, or 500 of FIGS. 2, 3, and 5.

As shown in FIG. 14, the system 1400 may include a programmable switched capacitor block that provides a functionality corresponding to the filter 1410 that is adaptively configured based on control signals from a UAB controller 1420 and a digital controller 1430. In some embodiments, the UAB controller 1420 may receive an input from an MCU 1440 and a direct memory access (DMA) component 1450 and may provide a control signal based on the combination of inputs from the MCU 1440 and DMA 1450. In some embodiments, the DMA 1450 and the MC 1440 may provide control information to modify the function of the filter 1410. Furthermore, the digital controller 1430, MCU 1440, and the DMA 1450 may receive an optimizing stimulus signal 1455.

As such, the filter 1410 that is implemented by a programmable switched capacitor block may be configured based on other components of a system on a chip.

Figure 15:
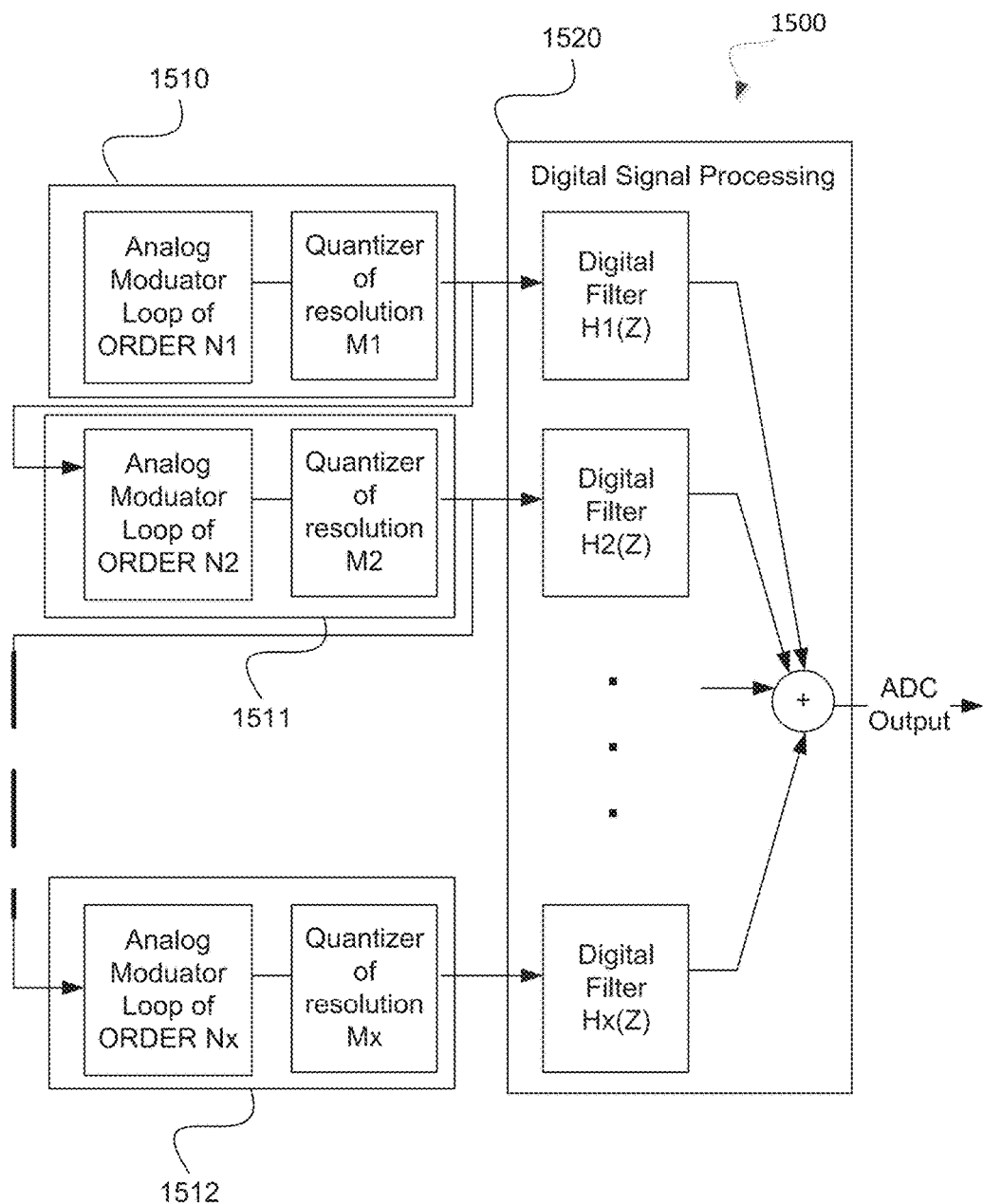
FIG. 15 is a block diagram of an example architecture of multiple programmable switched capacitor blocks functioning in a multi stage noise shaping architecture in accordance with some embodiments of the present disclosure.

FIG. 15 is a block diagram of an example architecture 1500 of multiple programmable switched capacitor blocks functioning in a multi stage noise shaping (MASH) architecture. In general, the architecture 1500 includes a coupling of multiple programmable switched capacitor blocks 222, 300, or 500 of FIGS. 2, 3, and 5.

As shown in FIG. 15, the system 1500 may include multiple programmable switched capacitor blocks 1510, 1511, and 1512 that are each programmed or configured to implement an analog modulator loop and a quantizer. Each of the programmable switched capacitor blocks 1510, 1511, and 1512 may be coupled to another of the programmable switched capacitor blocks. For example, a first programmable switched capacitor block 1510 may provide a function corresponding to an analog modular loop of a first order and a quantizer of a first resolution. The output of the first programmable switched capacitor block 1510 from the quantizer may be received as an input to a second programmable switched capacitor block 1511 that is implemented as an analog modulator loop of a second order and a quantizer of a second resolution. Similarly, the output of the second programmable switched capacitor block 1511 from the quantizer may be received as an input to the analog modular loop of the third programmable switched capacitor block 1512. Furthermore, as shown, the outputs of each of the programmable switched capacitor blocks 1510, 1511, and 1512 may be received by a digital signal processing component 1520 that includes digital filters where the outputs of the digital filters are combined to generate an analog to digital (ADC) output.

In some embodiments, the MASH architecture 1500 may include two or more cascaded programmable switched capacitor blocks where each of the blocks is programmed to function as a first-order sigma-delta modulator. The outputs of each of the programmable switched capacitor blocks, or sigma-delta modulators, are summed to provide an output (e.g., the ADC output) that includes a number of bits corresponding to the number of sigma-delta modulators implemented by the programmable switched capacitor blocks. Thus, stages of programmable switched capacitor blocks may be used to implement two or more stages of modulators where an ADC output is a number of bits that is equal to the number of stages of modulators that are implemented by the programmable switched capacitor blocks.

Figure 16:
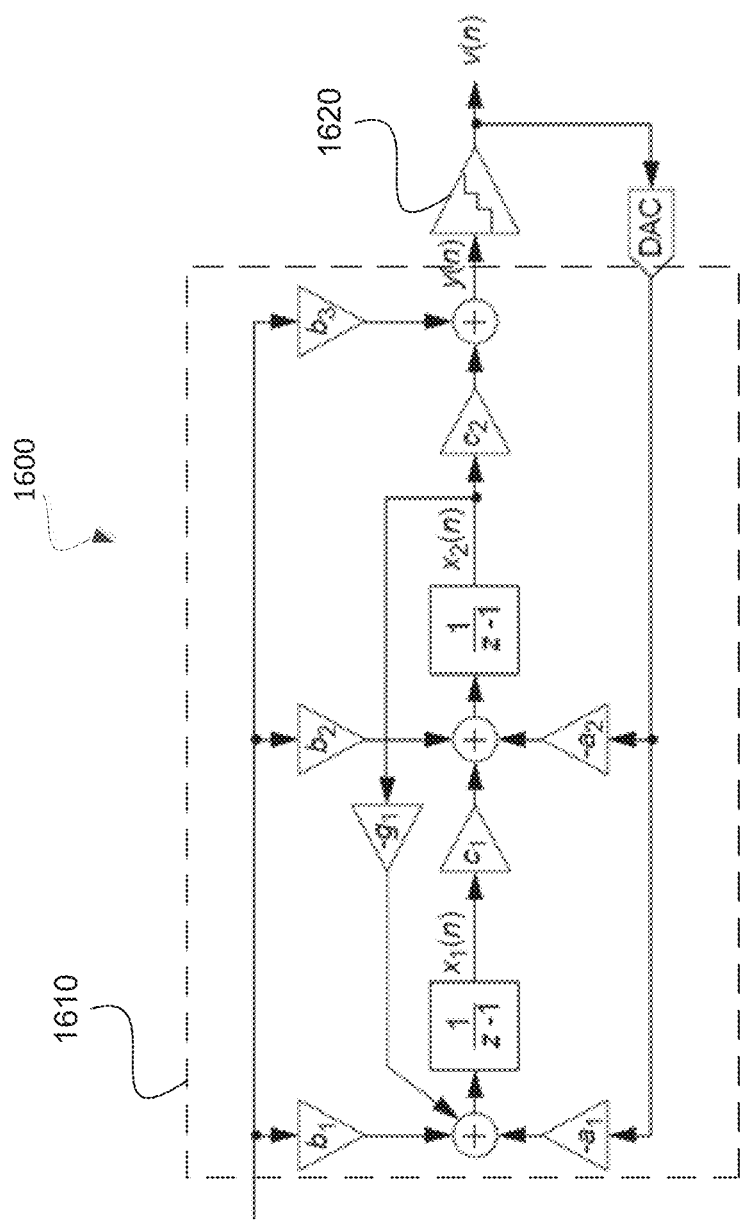
FIG. 16 is a block diagram of a mapping between components of a programmable switched capacitor block to the multi stage noise shaping architecture in accordance with some embodiments of the present disclosure.

FIG. 16 is a block diagram of a mapping 1600 between functionality of a programmable switched capacitor block to the multi stage noise shaping architecture. In general, mapping 1600 represents functionality of a programmable switched capacitor block 222, 300, or 500 of FIGS. 2, 3, and 5.

As shown in FIG. 16, the mapping 1600 represents a function of the analog loop modulator 1610 and a quantizer 1620. For example, the analog loop modulator 1610 may correspond to the analog loop modulator of a programmable switched capacitor block 1510, 1511, or 1512 as described in conjunction with FIG. 15. Furthermore, the quantizer 1620 may correspond to the quantizer of a programmable switched capacitor block 1510, 1511, or 1512 as described in conjunction with FIG. 15. In some embodiments, the quantizer 1620 may be implemented by a multi-level comparator of the programmable switched capacitor block.

Figure 17:
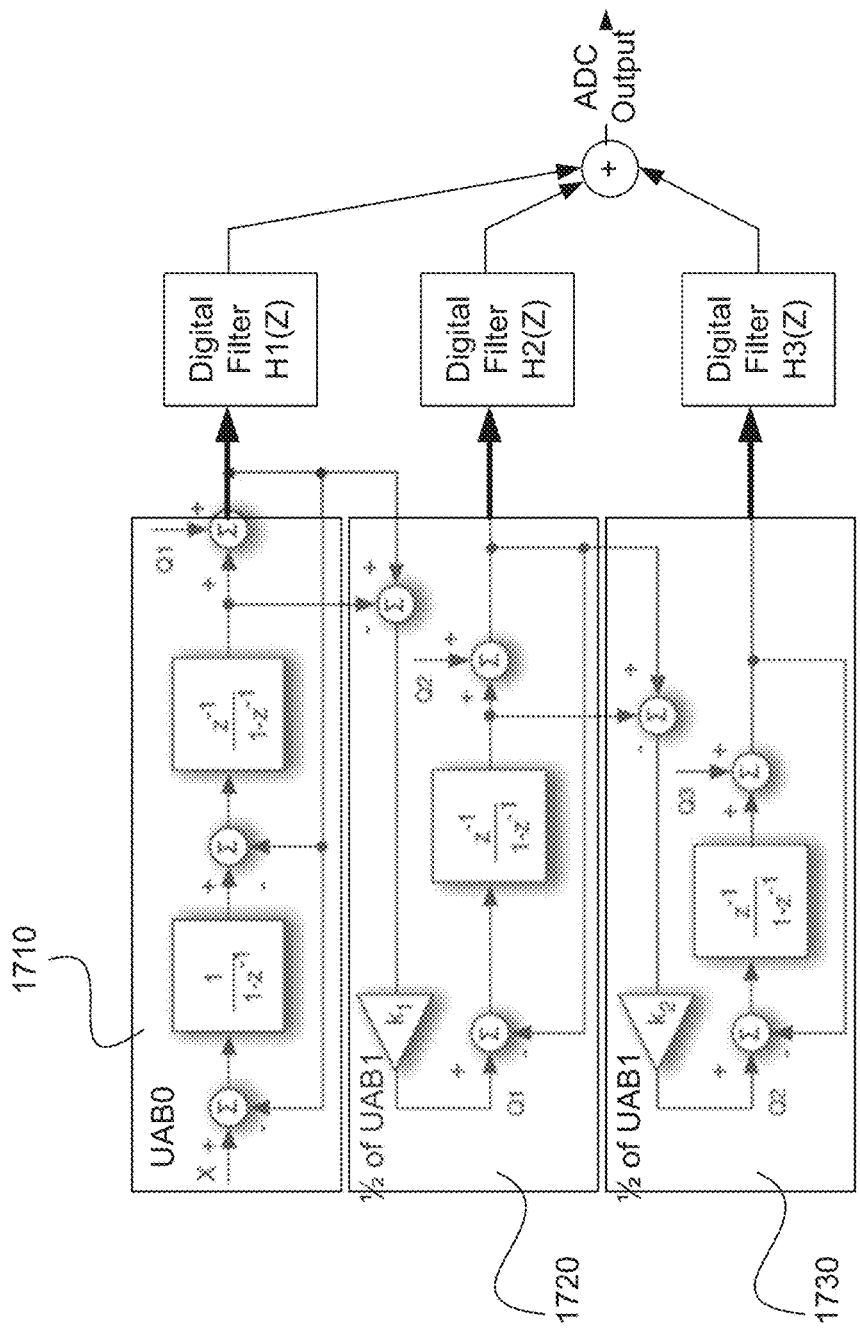
FIG. 17 is a block diagram of connecting programmable switched capacitor blocks to function in a multi stage noise shaping architecture in accordance with some embodiments of the present disclosure.

FIG. 17 is a block diagram of connecting programmable switched capacitor blocks to function in a multi stage noise shaping architecture. In general, a half block 1710 of a first programmable switched capacitor block may correspond to the first programmable switched capacitor block 1610, a half block 1720 of a second programmable switched capacitor block may correspond to the second programmable switched capacitor block 1620, and another half block 1730 of the second programmable switched capacitor block may correspond to the third programmable switched capacitor block 1630. As shown, each of the half blocks may perform a function corresponding to an analog modulator loop and a quantizer.

Figure 18:
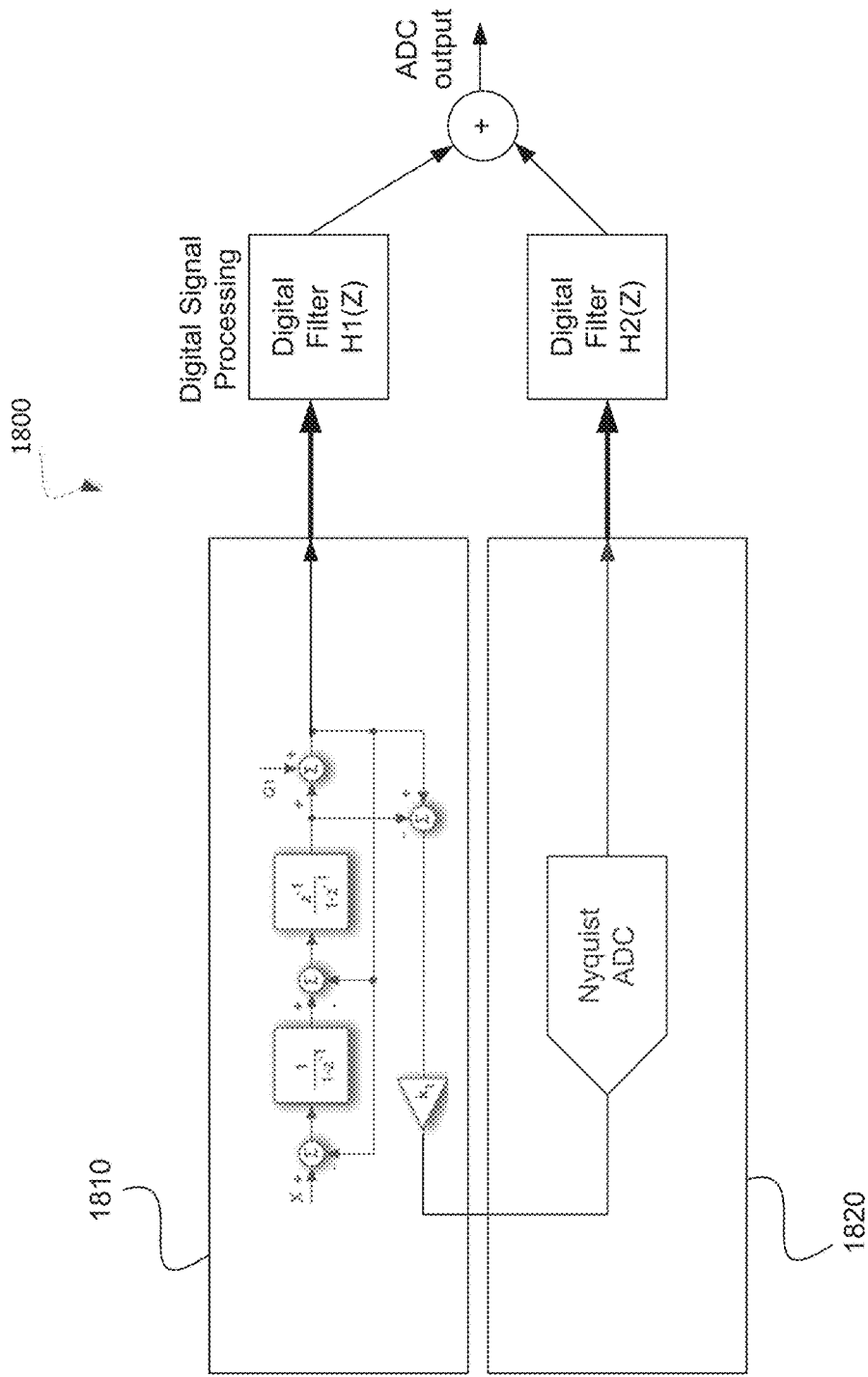
FIG. 18 is a block diagram of a programmable switched capacitor block functioning as a nyquist analog to digital converter in a multi stage noise shaping architecture in accordance with some embodiments of the present disclosure.

FIG. 18 is a block diagram of a programmable switched capacitor block functioning as a nyquist analog to digital converter in a multi stage noise shaping architecture 1800 in accordance with some embodiments of the present disclosure. In general, the architecture 1800 may include functionality of a nyquist analog to digital converter (ADC) that is implemented by a programmable switched capacitor block 222, 300, or 500 of FIGS. 2, 3, and 5.

As shown in FIG. 18, the architecture 1800 may include first programmable switched capacitor block 1810 implementing a second order sigma-delta modulator and a second programmable switched capacitor block 1820 implementing a nyquist ADC. In some embodiments, the nyquist ADC may correspond to a twelve bit quantizer that is based on a multi-level comparator of the second programmable switched capacitor block 1820. The second programmable switched capacitor block 1820 may receive an input from the first programmable switched capacitor block 1810 as shown. The output of the first programmable switched capacitor block 1810 and the output of the second programmable switched capacitor block 1820 may be received by digital filters and the outputs of the digital filters are summed to produce an ADC output.

Figure 19:
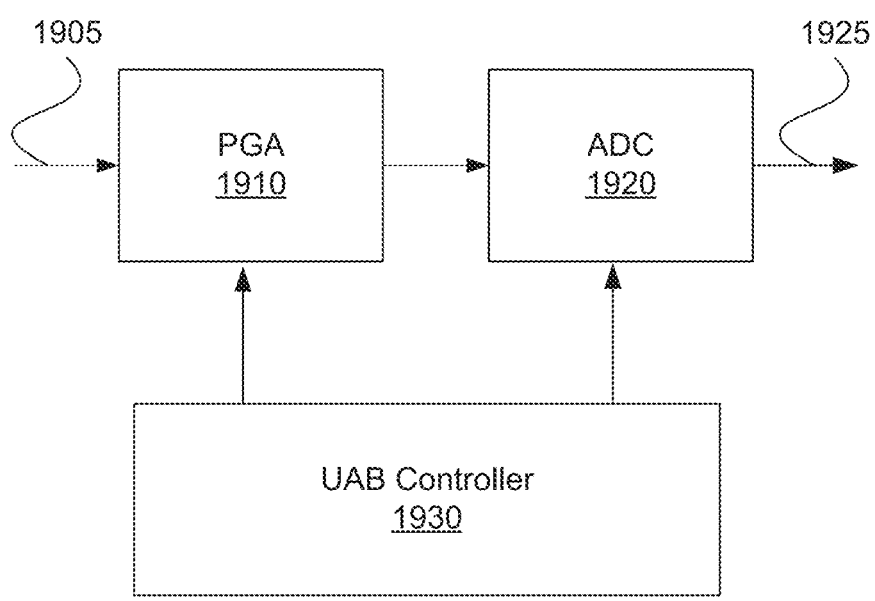
FIG. 19 is a block diagram of a programmable switched capacitor block functioning as a zoom analog to digital converter in accordance with some embodiments of the present disclosure.

FIG. 19 is a block diagram of a programmable switched capacitor block functioning as a zoom analog to digital converter. In general, the zoom analog to digital converter may include a programmable gain amplifier (PGA) component 1910 and an ADC 1920 that are implemented based on the programmable switched capacitor blocks 222, 300, or 500 of FIGS. 2, 3, and 5.

As shown in FIG. 19, a programmable switched capacitor block may be used to implement functionality of the PGA component 1910 and an ADC 1920. For example, a first half block of the programmable switched capacitor block may be programmed to implement the PGA component 1910 and a second half block of the programmable switched capacitor block may be programmed to implement the ADC 1920. In some embodiments, the PGA component 1910 may be used to zoom in on a particular range of the input 1905 and the ADC 1920 may subsequently be used to convert the analog output of the PGA component 1910 that corresponds to the zoomed particular range of the input 1905 to a digital output 1925. The UAB controller 1930 may configure the programmable switched capacitor block that is used to implement the PGA component 1910 and the ADC 1920. In some embodiments, a first half block of the programmable switched capacitor block may provide a function corresponding to the gain amplification of the PGA component 1910 and the second half block of the programmable switched capacitor block may provide another function corresponding to the ADC 1920.

Embodiments of the present disclosure, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the disclosure has been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. An apparatus comprising:
    a first portion of a programmable switched capacitor block comprising a first plurality of switched capacitors; and
    a second portion of the programmable switched capacitor block comprising a second plurality of switched capacitors,
    wherein a first switch associated with the first plurality of switched capacitors and a second switch associated with the second plurality of switched capacitors are configured based on a type of analog function that is to be provided by configuring the first switch associated with the first plurality of switched capacitors when the analog function operates on a single ended signal,
    wherein both the first switch associated with the first plurality of switched capacitors and the second switch associated with the second plurality of switched capacitors are configured when the analog function operates on a differential signal, and
    wherein each of the first portion and the second portion of the programmable switched capacitor block comprises a multi-level comparator configured to receive an input voltage from at least one of the first and second portions of the programmable switched capacitor block and compare the input voltage with a first reference threshold voltage to produce a first output that corresponds to the first threshold voltage and compare the input voltage with a second reference threshold voltage that is generated from the first reference threshold voltage to produce a second output that corresponds to the second threshold voltage, wherein the first output is different than the second output.

2. The apparatus of claim 1, wherein the first switch and the second switch are further configured based on the output of the multi-level comparator.

3. The apparatus of claim 1, wherein the analog function corresponds to an oscillator function, and wherein the first portion and the second portion correspond to an integrator operation for the oscillator function.

4. The apparatus of claim 1, wherein the analog function corresponds to a median filter function, and wherein the first and second switches are configured based on the type of analog function is further based on the output of the multi-level comparator of at least one of the first portion or the second portion to modify an operation of the median filter function.

5. The apparatus of claim 1, wherein the type of analog function corresponds to a filter function and an analog to digital converter function, and wherein the first portion provides an operation associated with the filter function and the second portion provides an operation associated with the analog to digital converter function.

6. The apparatus of claim 1, further comprising a bus coupled to the first and second portions of the programmable switched capacitor block to provide an output of a component of the second portion to the first portion.

7. A method comprising:
    receiving a signal corresponding to a type of analog function that is to be provided by a programmable switched capacitor block;
    configuring a first portion of the programmable switched capacitor block to receive a first input signal and to transmit a first output signal by operating a first switch of the first portion based on the type of analog function that is to be provided, wherein the first switch of the first portion is associated with a first plurality of switched capacitors; and configuring a second portion of the programmable switched capacitor block to receive a second input signal and to transmit a second output signal by operating a second switch of the second portion based on the type of analog function that is to be provided, wherein the second switch of the second portion is associated with a second plurality of switched capacitors, wherein the first switch associated with the first plurality of switched capacitors is configured when the type of analog function operates on a single ended signal and both the first switch associated with the first plurality of switched capacitors and the second switch associated with the second plurality of switched capacitors are configured when the type of analog function operates on a differential signal, and wherein each of the first portion and the second portion of the programmable switched capacitor block comprises a multi-level comparator configured to receive an input voltage from at least one of the first and second portions of the programmable switched capacitor block and compare the input voltage with a first reference threshold voltage to produce a first output that corresponds to the first threshold voltage and compare the input voltage with a second reference threshold voltage that is generated from the first reference threshold voltage to produce a second output that corresponds to the second threshold voltage, wherein the first output is different than the second output.

8. The method of claim 7,
wherein the analog function corresponds to a delta-sigma digital to analog converter function that is based on the output of the multi-level comparator.

9. The method of claim 7, wherein the analog function corresponds to an oscillator function, and wherein the first portion and the second portion correspond to an integrator operation for the oscillator function.

10. The method of claim 7, wherein the configuring of the first and second switches is based on opening or closing of the first and second switches.

11. The method of claim 7, wherein the analog function corresponds to a median filter function, and wherein the configuring based on the type of analog function is further based on the output of the multi-level comparator of at least one of the first portion or the second portion to modify an operation of the median filter function.

12. The method of claim 7, further comprising providing an output of a component of the second portion to the first portion via a bus that is coupled to the first and second portions of the programmable switched capacitor block.

13. The method of claim 7, wherein the type of analog function corresponds to a filter function and an analog to digital converter function, and wherein the first portion provides an operation associated with the filter function and the second portion provides an operation associated with the analog to digital converter function.

14. A system comprising:
a processing device to generate a programming signal that specifies a type of analog function that is to be provided by a programmable switched capacitor block;
a first portion of the programmable switched capacitor block comprising a first plurality of switched capacitors; and
a second portion of the programmable switched capacitor block comprising a second plurality of switched capacitors,
wherein a first switch associated with the first plurality of switched capacitors and a second switch associated with the second plurality of switched capacitors are configured based on the type of analog function that is specified by the programming signal by configuring the first switch associated with the first plurality of switched capacitors when the analog function operates on a single ended signal and configuring both the first switch associated with the first plurality of switched capacitors and the second switch associated with the second plurality of switched capacitors when the analog function operates on a differential signal, and
wherein each of the first portion and the second portion of the programmable switched capacitor block comprises a multi-level comparator configured to receive an input voltage from at least one of the first and second portions of the programmable switched capacitor block and compare the input voltage with a first reference threshold voltage to produce a first output that corresponds to the first threshold voltage and compare the input voltage with a second reference threshold voltage that is generated from the first reference threshold voltage to produce a second output that corresponds to the second threshold voltage, wherein the first output is different than the second output.

15. The system of claim 14, wherein the analog function corresponds to a filter function that is adaptively controlled.

16. The system of claim 14, wherein the first portion and the second portion each correspond to an analog modulator loop function and a quantizer function, and wherein an output of the quantizer function of the first portion is an input to the analog modular loop function of the second portion.

17. The system of claim 16, wherein the first portion and the second portion correspond to a multi-stage noise shaping architecture.

18. The system of claim 14, wherein the first portion corresponds to a type of sigma-delta modulator function and the second portion corresponds to a nyquist analog to digital converter function.

19. The system of claim 14, wherein the first portion corresponds to a programmable gain amplifier operation and the second portion corresponds to an analog to digital converter operation, and wherein the type of analog function corresponds to a zoom analog to digital converter function.

* * * * *